United States Patent
Schmittner et al.

(10) Patent No.: US 12,353,137 B2
(45) Date of Patent: Jul. 8, 2025

(54) FIELD FACET SYSTEM AND LITHOGRAPHY APPARATUS

(71) Applicant: Carl Zeiss SMT GmbH, Oberkochen (DE)

(72) Inventors: Arno Schmittner, Aalen (DE); Willi Anderl, Huettlingen (DE); Stefan Lippoldt, Aalen (DE); Joram Rosseels, Putte (BE); Rob Wilhelmus Maria Janssen, Meerssen (NL)

(73) Assignee: Carl Zeiss SMT GmbH, Oberkochen (DE)

(*) Notice: Subject to any disclaimer, the term of this patent is extended or adjusted under 35 U.S.C. 154(b) by 239 days.

(21) Appl. No.: 18/318,342

(22) Filed: May 16, 2023

(65) Prior Publication Data
US 2023/0384685 A1 Nov. 30, 2023

Related U.S. Application Data

(63) Continuation of application No. PCT/EP2021/081866, filed on Nov. 16, 2021.

(30) Foreign Application Priority Data

Nov. 25, 2020 (DE) ......................... 102020214798.1

(51) Int. Cl.
*G03F 7/00* (2006.01)
*G02B 26/08* (2006.01)

(52) U.S. Cl.
CPC ..... *G03F 7/70075* (2013.01); *G02B 26/0825* (2013.01); *G03F 7/70116* (2013.01); *G03F 7/7015* (2013.01)

(58) Field of Classification Search
CPC .............. G03F 7/70075; G03F 7/7015; G03F 7/70091; G02B 26/0833; G02B 5/09; G02B 5/0891; G02B 27/0983; G02B 26/0825
See application file for complete search history.

(56) References Cited

U.S. PATENT DOCUMENTS

2004/0257683 A1 12/2004 Petasch et al.

FOREIGN PATENT DOCUMENTS

| DE | 10151919 A1 | 5/2003 |
| DE | 102013206981 A1 | 12/2013 |
| DE | 102017221420 A1 | 11/2018 |
| EP | 1026547 A2 | 8/2000 |
| WO | WO2016128253 A1 | 8/2016 |

OTHER PUBLICATIONS

Translation of International Search Report for corresponding PCT Appl No. PCT/EP2021/081866, dated Mar. 14, 2022.

*Primary Examiner* — Steven H Whitesell
(74) *Attorney, Agent, or Firm* — Fish & Richardson P.C.

(57) ABSTRACT

A field facet system for a lithography apparatus comprises: an optical element which comprises an elastically deformable facet portion having a light-reflecting optically active surface; and at least one actuating element for introducing a bending moment into the facet portion to deform the facet portion to change a radius of curvature of the optically active surface. The facet portion is curved in an arched manner in a plan view of the optically active surface. The rigidity of the facet portion as viewed along a longitudinal direction of the facet portion is variable so that a normal vector oriented perpendicularly to the optically active surface tilts exclusively about a spatial direction when the bending moment is introduced into the facet portion.

20 Claims, 17 Drawing Sheets

FIELD FACET SYSTEM AND LITHOGRAPHY APPARATUS

CROSS-REFERENCE TO RELATED APPLICATIONS

The present application is a continuation of, and claims benefit under 35 USC 120 to, international application PCT/EP2021/081866, filed Nov. 16, 2021, which claims benefit under 35 USC 119 of German Application No. 10 2020 214 798.1, filed Nov. 25, 2020. The entire disclosure of these applications are incorporated by reference herein.

FIELD

The present disclosure relates to a field facet system for a lithography apparatus, and to a lithography apparatus comprising such a facet system.

BACKGROUND

Microlithography is used for producing microstructured component parts, such as for example integrated circuits. The microlithography process is performed using a lithography apparatus, which has an illumination system and a projection system. The image of a mask (reticle) illuminated via the illumination system is in this case projected via the projection system onto a substrate, for example a silicon wafer, which is coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses (extreme ultraviolet, EUV) that use light with a wavelength in the range of 0.1 nm to 30 nm, for example 13.5 nm. In the case of such EUV lithography apparatuses, because of the high absorption of light of this wavelength by most materials, reflective optical units, that is to say mirrors, are usually used instead of—as previously—refractive optical units, that is to say lens elements. The mirrors operate either with almost normal incidence or with grazing incidence.

The illumination system comprises, for example, a field facet mirror and a pupil facet mirror. The field facet mirror and the pupil facet mirror can be in the form of so-called facet mirrors, wherein such facet mirrors often have hundreds of facets in each case. The facets of the field facet mirror are also referred to as "field facets" and the facets of the pupil facet mirror as "pupil facets". A plurality of pupil facets can be assigned to one field facet. In order to obtain a good illumination in conjunction with a high numerical aperture, it is desirable for the one field facet to be switchable between the pupil facets assigned to it.

By virtue of the fact that the one field facet is switchable, the distance between the one field facet and the pupil facet assigned thereto is generally different for each switching position. Given a fixed refractive power of the one field facet, the image on the corresponding pupil facet can be defocused depending on the switching position. This defocusing can result in a limitation in the reduction of the degree of pupil filling. In the present case here the "degree of pupil filling" should be understood to mean the ratio of an irradiated surface area relative to a total optically effective surface area of the respective pupil facet. In order to obtain higher resolutions of the projection system, it can be desirable, however, to further reduce the degree of pupil filling.

It is therefore typically desirable for the field facets to be deformable depending on their switching position in order at least to reduce or entirely eliminate the defocusing.

DE 10 2017 221 420 A1 describes an EUV illumination system for an EUV lithography apparatus, a lithography apparatus, and also a method for generating illumination radiation by way of an EUV illumination system.

DE 10 2013 206 981 A1 discloses a facet mirror for a projection exposure apparatus and also a corresponding projection exposure apparatus and a method for operating the facet mirror and respectively the projection exposure apparatus.

DE 101 51 919 A describes an optical element having an optical axis, and also a device for introducing a two- or multiple-wave deformation into the optical element.

SUMMARY

The present disclosure seeks to propose an improved field facet system.

A field facet system for a lithography apparatus is proposed. The field facet system comprises an optical element, wherein the optical element comprises an elastically deformable facet portion having a light-reflecting optically effective surface, and at least one actuating element for introducing a bending moment into the facet portion in order to deform the facet portion in such a way as to change a radius of curvature of the optically effective surface, wherein the facet portion is curved arcuately in a plan view of the optically effective surface, and wherein the stiffness of the facet portion is variable as viewed along a longitudinal direction of the facet portion in such a way that a normal vector oriented perpendicularly to the optically effective surface tilts exclusively about a spatial direction when the bending moment is introduced into the facet portion.

What can be achieved as a result of the variable stiffness of the facet portion is that the facet portion does not undergo torsion, but rather only flexure, when the bending moment is introduced.

The field facet system is for example part of a beam shaping and illumination system of the lithography apparatus. For example, the field facet system is part of a facet mirror, for example of a field facet mirror. Such a facet mirror can comprise a multiplicity of such field facet systems arranged linearly or in the shape of a pattern. In this case, each field facet system can be tilted by itself into a plurality of different tilt positions. For this purpose, each field facet system can comprise a further actuating element suitable for tilting the entire field facet system as one unit. The last-mentioned actuating element can be a so-called Lorentz actuator.

The optical element can be a facet, mirror facet or field facet or can be designated as such. The facet portion is for example in the shape of a rod or in the shape of a beam and can have a rectangular, trapezoidal or any other geometry in cross section. The facet portion has for example a width, a length and a thickness. The ratio of the length to the width can be approximately 10:1. The thickness can be smaller than the width. A coordinate system having a first spatial direction or x-direction, a second spatial direction or y-direction and a third spatial direction or z-direction is assigned to the field facet system. The spatial directions are positioned perpendicularly to one another.

The width is oriented along the x-direction. Therefore, the x-direction can also be referred to as the width direction. The length is oriented along the y-direction. Therefore, the y-direction can also be referred as the longitudinal direction or length direction. The thickness is oriented along the z-direction. Therefore, the z-direction can also be referred as the thickness direction or vertical direction. The "length direction" should be understood to mean, for example, that spatial direction in which the optical element has its largest geometric extent.

The optical element can be produced from a mirror substrate or substrate. The substrate can comprise for example copper, for example a copper alloy, an iron-nickel alloy, such as Invar, for example, or some other suitable material. The optically effective surface is provided on the front side at the facet portion, that is to say facing away from the main body. The optically effective surface can be a mirror surface. The optically effective surface can be produced with the aid of a coating applied to the substrate.

The optically effective surface is suitable for reflecting light, for example EUV radiation. However, this does not preclude at least some of the light being absorbed by the facet portion, as a result of which heat is introduced into the latter. The facet portion or the optically effective surface has an arcuate or crescent-shaped geometry in plan view, that is to say in a viewing direction perpendicular to the optically effective surface.

The optically effective surface can be curved. In the simplest case, the optically effective surface is cylindrically curved. However, the shape of the optically effective surface can also be a torus or an ellipsoid. For the case where a toroidal geometry is provided, the latter has a vertex. The optically effective surface can comprise a first radius of curvature, which specifies the curvature of the optically effective surface in a plane spanned by the y-direction and the z-direction.

Furthermore, the optically effective surface can comprise a second radius of curvature, which differs from the first radius of curvature and specifies the curvature of the optically effective surface in a plane spanned by the x-direction and the z-direction. The first radius of curvature and the second radius of curvature are positioned perpendicularly to one another. The radii of curvature intersect at the abovementioned vertex, for example. The first radius of curvature can be greater than the second radius of curvature. For example, the first radius of curvature is alterable with the aid of the deformation of the facet portion. Depending on the arrangement of the actuating element or actuating elements, however, the second radius of curvature can also be influenced.

The actuating element or actuating elements can be referred to as actuators. At least two actuating elements can be provided. However, it is also possible for three, four, five, six, seven, eight, nine, ten or eleven actuating elements to be provided. More than eleven actuating elements are possible as well. It is also possible for only one actuating element to be provided. That is to say that the number of actuating elements is arbitrary, in principle. The actuating elements can be so-called displacement actuators. A "displacement actuator" should be understood to mean an actuating element which, in contrast to a force actuator, does not predefine a fixed force, but rather a displacement. A "force actuator", by contrast, should be understood to mean an actuating element which, in contrast to a displacement actuator, does not predefine a fixed displacement, but rather a force. One example of a displacement actuator is a piezoelement. One example of a force actuator is a Lorentz actuator as already mentioned above. That is to say that the actuating elements can be or comprise piezoelements or piezostacks. However, the actuating elements can also be pneumatic or hydraulic actuating elements, for example.

A control unit can be assigned to the actuating element or actuating elements and can enable the actuating element or actuating elements to be controlled, for example energized, such that they deform the facet portion. By way of example, the actuating elements are brought from an undeflected state to a deflected state with the aid of energization. An arbitrary number of intermediate states are provided between the undeflected state and the deflected state. As soon as the actuating elements are no longer energized, they can bring themselves automatically from the deflected state back to the undeflected state. Optionally, the radius of curvature, for example the first radius of curvature, or the radii of curvature can be altered in a continuously variable manner with the aid of the actuating elements.

The fact that the facet portion is "elastically deformable" in the present case means that the facet portion can be brought from an undeflected or undeformed state to a deflected or deformed state and back again. In the undeformed state, the, for example first, radius of curvature can be greater than in the deformed state. In order to bring the facet portion from the undeformed state to the deformed state, a bending moment is introduced into the facet portion with the aid of the actuating elements. By way of example, two oppositely oriented bending moments are introduced into two end regions of the facet portion. Hereinafter, however, reference is made just to one bending moment.

As soon as the bending moment is no longer applied to the facet portion, the latter automatically can deform from the deformed state back to the undeformed state. That is to say that the deforming or deformation of the facet portion can be reversible. For example, the facet portion is prestressed, for example spring-prestressed, in the direction of the undeformed state. In the undeformed state, the optically effective surface can be planar or have a cylindrical curvature.

As mentioned above, the plan view should be understood to mean a viewing direction perpendicular to the optically effective surface. The "stiffness" in the present case should be understood to mean for example the resistance of the facet portion or generally a body to an elastic deformation owing to a force or a moment. For example, the "stiffness" should be understood to mean the torsional stiffness of the facet portion, i.e. the stiffness to withstand a torsional moment that twists the facet portion or subjects it to torsion. The stiffness of a component is dependent firstly on the elastic properties of the material, such as the modulus of elasticity, for example, and secondly on the geometry of the deformed component.

By virtue of the fact that the stiffness is variable, it can be adapted in such a way that when the bending moment is introduced into the facet portion, the latter does not undergo torsion, i.e. become twisted on itself, about the second spatial direction. This can prevent the normal vector from tilting about the second spatial direction. In the present case, the "normal vector" should be understood to mean a vector which is oriented perpendicularly to the optically effective surface. The bending moment acts about the first spatial direction. In the present case, "exclusively" should be understood for example such that even, albeit only slight, tilting of the normal vector about the second spatial direction is permissible. However, this tilting is always so small that in general the optical properties of the optically effective surface are not disadvantageously influenced.

The bending moment can result only in a bending of the facet portion, but for example not in a torsion or twisting thereof. The longitudinal direction extends substantially along the second spatial direction. In this case, the longitudinal direction, like the facet portion itself, can be curved.

The facet portion can have a first end region and a second end region, into which oppositely oriented bending moments can be introduced. A plane of symmetry of the facet portion is provided centrally between the end regions. The longitudinal direction is oriented from the respective end region toward the plane of symmetry.

The main body and the facet portion can be embodied in one piece, for example materially in one piece. In the present case, "in one piece" or "integrally" means that the main body and the facet portion form a common component and are not composed of different component parts. In the present case, "materially in one piece" means that the main body and the facet portion are manufactured from the same material throughout. Alternatively, the main body and the facet portion can also be two mutually separate components which are connected to each other.

In accordance with one embodiment, the modulus of elasticity of the facet portion is variable as viewed along the longitudinal direction.

By way of example, the modulus of elasticity can decrease proceeding from the end regions in the direction of the plane of symmetry. A profile or gradient of the modulus of elasticity is thus provided. Gradient in the present case denotes the profile of the change in a numerical physical variable as a function of the location. The gradient of a variable indicates for each location how much the variable changes and in what direction the change is the greatest. A variation of the modulus of elasticity as mentioned above can be attained by the use of a monolithically manufactured base body, for example of the facet portion, composed of two or more different materials. In this case, the base body forms the facet portion or the facet portion is manufactured from the base body. The base body can also comprise the main body. Such a base body can be produced from different materials, for example metal powders, by welding, plating or optionally by additive manufacturing, for example 3D printing. Using additive manufacturing methods, for example, hybrid components, for example the facet portion, can be produced with a continuous transition between two different materials, for example copper and steel. At least the facet portion can thus have a hybrid construction, for example composed of steel and copper. The main body, too, can have such a hybrid construction.

In accordance with a further embodiment, the polar section modulus of a cross section of the facet portion is variable as viewed along the longitudinal direction.

A combination of the variable modulus of elasticity and the variable polar section modulus can also be provided. The polar section modulus is a measure of what resistance to the arising of internal stresses is offered by a beam during loading. The polar section modulus can be influenced by a geometry of the cross section. By way of example, the polar section modulus can decrease proceeding from the end regions of the facet portion in the direction of the plane of symmetry.

In accordance with a further embodiment, the cross section is trapezoidal.

The cross section of the facet portion is for example not limited just to trapezoidal cross sections, but rather can have an arbitrary geometry with at least two variable cross-section parameters, such as width and height, for example. Cross sections in the shape of rectangles, triangles, semi-ellipses, rectangles with truncated corners or other more complex cross sections are conceivable, for example.

In accordance with a further embodiment, the cross section comprises a first width facing the optically effective surface and a second width facing away from the optically effective surface, wherein the first width is greater than the second width.

That is to say that the cross section tapers proceeding from the optically effective surface. The facet portion has for example a top side, at which the optically effective surface is provided, and an underside. The top side has the first width. The underside has the second width.

In accordance with a further embodiment, the first width is constant as viewed along the longitudinal direction, wherein the second width is variable as viewed along the longitudinal direction.

That is to say that the first width for example does not change and hence is also not variable. By way of example, the second width decreases proceeding from the end regions toward the plane of symmetry.

In accordance with a further embodiment, the cross section comprises a height which is variable as viewed along the longitudinal direction.

The height is oriented for example along the third spatial direction. By way of example, the height decreases proceeding from the end regions of the facet portion toward the plane of symmetry.

In accordance with a further embodiment, the facet portion comprises a first end region and a second end region, wherein the facet portion is constructed mirror-symmetrically with respect to a plane of symmetry arranged centrally between the first end region and the second end region.

The mirror symmetry relates to the geometric construction, that is to say the dimensions, of the facet portion. However, the mirror symmetry also relates to the stiffness of the facet portion. By way of example, the facet portion has identical stiffnesses at a predetermined distance from its plane of symmetry on both sides of the plane of symmetry.

In accordance with a further embodiment, the cross section is the smallest in the plane of symmetry.

For example, a cross-sectional area of the cross section is the smallest in the plane of symmetry.

In accordance with a further embodiment, the cross section increases in size proceeding from the plane of symmetry in the direction of the first end region and in the direction of the second end region.

That is to say that the cross-sectional area of the cross section is larger at the end regions than in the plane of symmetry.

In accordance with a further embodiment, the field facet system furthermore comprises at least two actuating elements configured to introduce oppositely oriented bending moments into the end regions.

As mentioned above, the number of actuating elements is arbitrary, in principle. More or fewer than two actuating elements can also be provided. The actuating elements can be linear actuating elements. For example, the actuating elements are piezoactuators.

In accordance with a further embodiment, the field facet system comprises a first spatial direction, about which the normal vector tilts exclusively when the bending moment is introduced into the facet portion, a second spatial direction, which is oriented perpendicularly to the first spatial direction, and a third spatial direction, which is oriented perpendicularly to the first spatial direction and the second spatial direction.

That is to say that a coordinate system comprising the first spatial direction, the second spatial direction and the third spatial direction is assigned to the field facet system. The first spatial direction corresponds to the x-direction mentioned above. The second spatial direction corresponds to the y-direction mentioned above. The third spatial direction corresponds to the z-direction mentioned above.

In accordance with a further embodiment, the bending moment acts about the first spatial direction.

For example, the bending moment acts exclusively about the first spatial direction. For this purpose, a lever arm connected to the facet portion can be provided, which lever arm is deflected with the aid of the actuating element. Such a lever arm can be assigned to each actuating element.

In accordance with a further embodiment, the facet portion deforms exclusively in a plane spanned by the second spatial direction and the third spatial direction when the bending moment is introduced.

This is achieved by virtue of the stiffness of the facet portion varying. The aforementioned plane can be oriented perpendicularly to the plane of symmetry.

Further, a lithography apparatus comprising such a field facet system is proposed.

The lithography apparatus can comprise a multiplicity of such field facet systems. The lithography apparatus can be an EUV lithography apparatus or a DUV lithography apparatus. EUV stands for "extreme ultraviolet" and denotes a wavelength of the working light of between 0.1 nm and 30 nm. DUV stands for "deep ultraviolet" and denotes a wavelength of the working light of between 30 nm and 250 nm.

"A (n); one" in the present case should not necessarily be understood as restrictive to exactly one element. Rather, a plurality of elements, such as for example two, three or more, may also be provided. Any other numeral used here should also not be understood to the effect that there is a restriction to exactly the stated number of elements. Rather, unless indicated otherwise, numerical deviations upwards and downwards are possible.

The embodiments and features described for the field facet system apply correspondingly to the proposed lithography apparatus, and vice versa.

Further possible implementations of the disclosure also comprise not explicitly mentioned combinations of features or embodiments that are described above or below with respect to the exemplary embodiments. In this case, a person skilled in the art will also add individual aspects as improvements or supplementations to the respective basic form of the disclosure.

Further configurations and aspects of the disclosure are the subject matter of the dependent claims and also of the exemplary embodiments of the disclosure described hereinafter.

BRIEF DESCRIPTION OF THE DRAWINGS

The disclosure is explained in greater detail below on the basis of preferred embodiments with reference to the appended figures.

DETAILED DESCRIPTION

Unless indicated otherwise, elements that are identical or functionally identical have been provided with the same reference signs in the figures. It should also be noted that the illustrations in the figures are not necessarily true to scale.

Figure 1A:
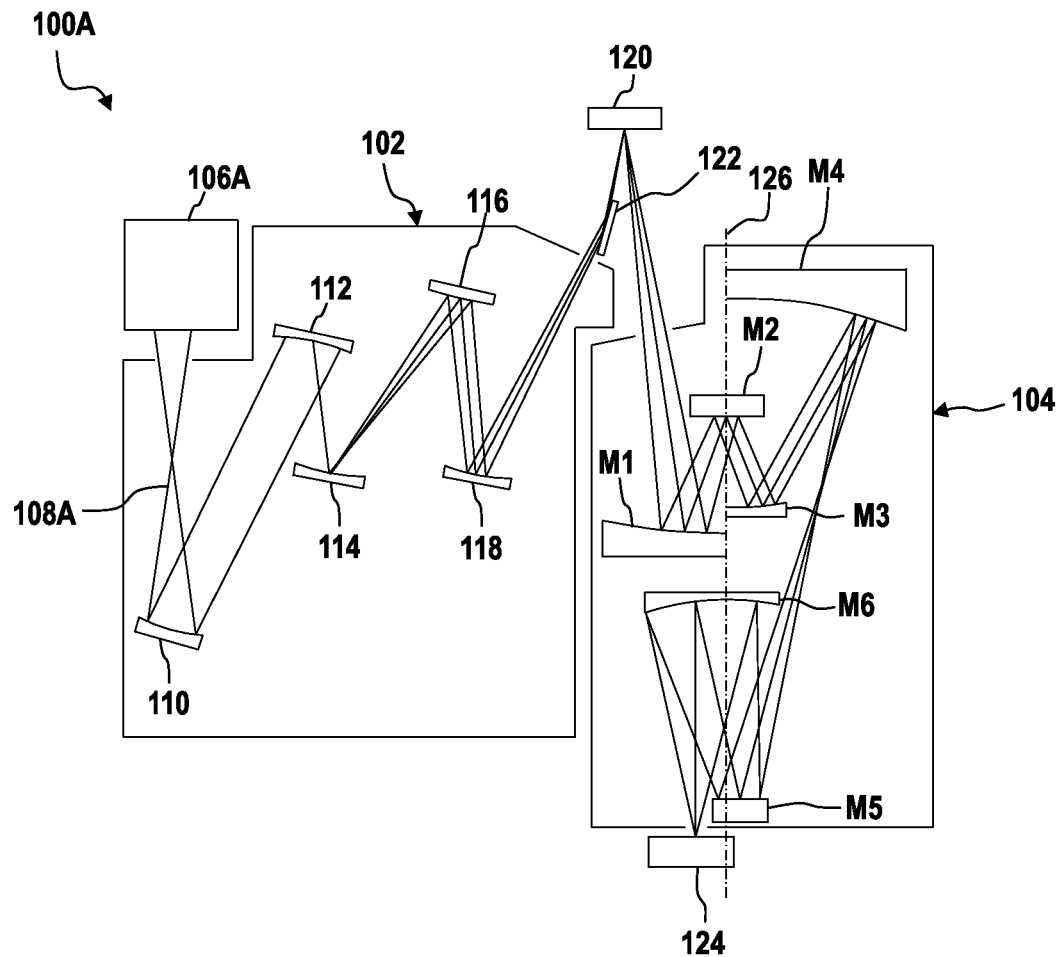
FIG. 1A shows a schematic view of an embodiment of an EUV lithography apparatus.

FIG. 1A shows a schematic view of an EUV lithography apparatus 100A comprising a beam shaping and illumination system 102 and a projection system 104. In this case, EUV stands for "extreme ultraviolet" and denotes a wavelength of the working light of between 0.1 nm and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which driving apparatuses for mechanically moving or setting optical elements are provided. Furthermore, electrical controllers and the like may also be provided in the machine room.

The EUV lithography apparatus 100A has an EUV light source 106A. A plasma source (or a synchrotron), which emits radiation 108A in the EUV range (extreme ultraviolet range), that is to say for example in the wavelength range of 5 nm to 20 nm, can for example be provided as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam guiding spaces in the beam shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is guided onto a photomask (referred to as a reticle) 120. The photomask 120 is likewise embodied as a reflective optical element and can be arranged outside the systems 102, 104. Furthermore, the EUV radiation 108A can be directed onto the reticle 120 via a mirror 122. The reticle 120 has a structure which is imaged on a wafer 124 or the like in reduced form via the projection system 104.

The projection system 104 (also referred to as a projection lens) has six mirrors M1 to M6 for imaging the photomask 120 onto the wafer 124. In this case, individual mirrors M1 to M6 of the projection system 104 can be arranged symmetrically in relation to an optical axis 126 of the projection system 104. It should be noted that the number of mirrors M1 to M6 of the EUV lithography apparatus 100A is not restricted to the number shown. A greater or lesser number of mirrors M1 to M6 can also be provided. Furthermore, the mirrors M1 to M6 are generally curved on their front sides for beam shaping.

Figure 1B:
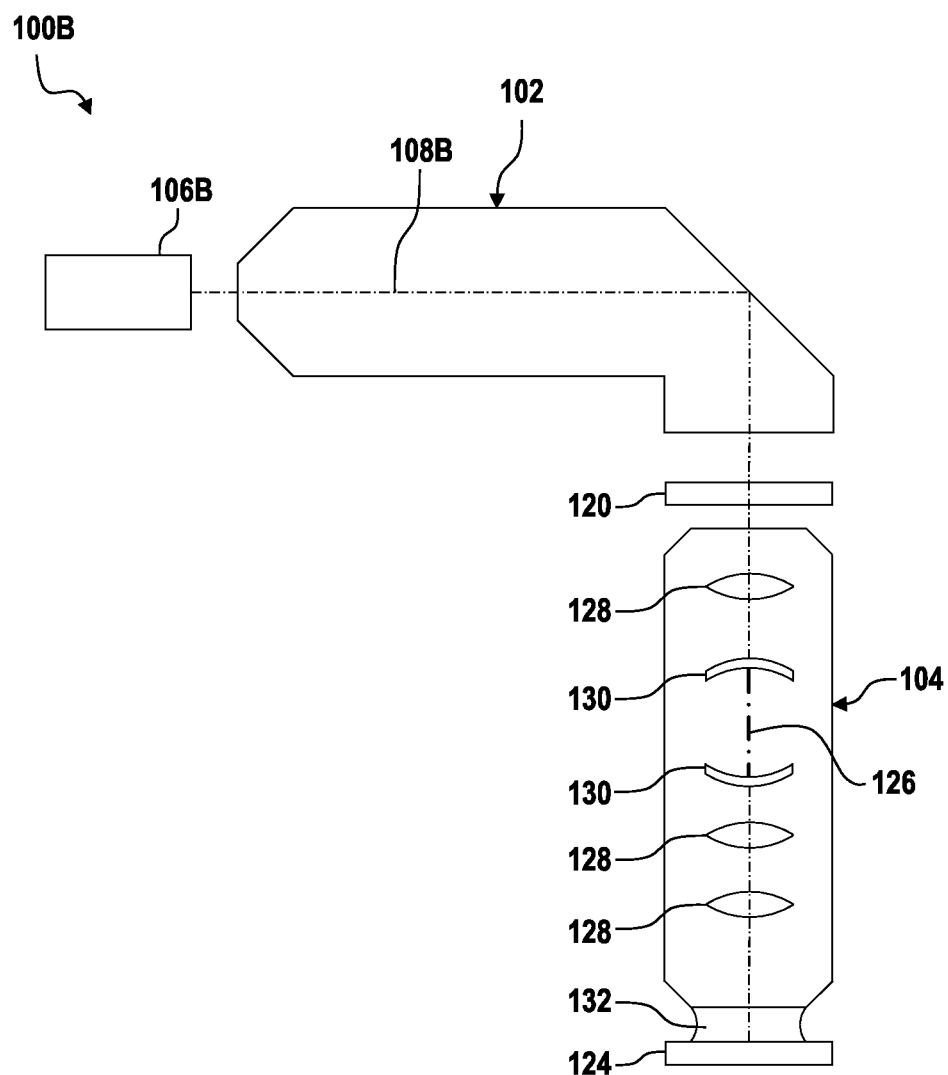
FIG. 1B shows a schematic view of an embodiment of a DUV lithography apparatus.

FIG. 1B shows a schematic view of a DUV lithography apparatus 100B, which comprises a beam shaping and illumination system 102 and a projection system 104. In this case, DUV stands for "deep ultraviolet" and denotes a wavelength of the working light of between 30 nm and 250 nm. As has already been described with reference to FIG. 1A, the beam shaping and illumination system 102 and the projection system 104 can be surrounded by a machine room with corresponding drive devices.

The DUV lithography apparatus 100B has a DUV light source 106B. An ArF excimer laser, for example, can be provided as the DUV light source 106B, which laser emits radiation 108B in the DUV range at, for example, 193 nm.

The beam shaping and illumination system 102 shown in FIG. 1B directs the DUV radiation 108B onto a reticle 120. The photomask 120 is formed as a transmissive optical element and may be arranged outside the systems 102, 104.

The photomask 120 has a structure which is imaged onto a wafer 124 or the like in a reduced fashion via the projection system 104.

The projection system 104 has a plurality of lens elements 128 and/or mirrors 130 for imaging the reticle 120 onto the wafer 124. In this case, individual lens elements 128 and/or mirrors 130 of the projection system 104 can be arranged symmetrically in relation to an optical axis 126 of the projection system 104. It should be noted that the number of lens elements 128 and mirrors 130 of the DUV lithography apparatus 100B is not restricted to the number shown. A greater or lesser number of lens elements 128 and/or mirrors 130 can also be provided. Furthermore, the mirrors 130 are generally curved on their front sides for beam shaping.

An air gap between the last lens element 128 and the wafer 124 can be replaced by a liquid medium 132 having a refractive index>1. The liquid medium 132 can be high-purity water, for example. Such a set-up is also referred to as immersion lithography and has an increased photolithographic resolution. The medium 132 can also be referred to as an immersion liquid.

Figure 2:
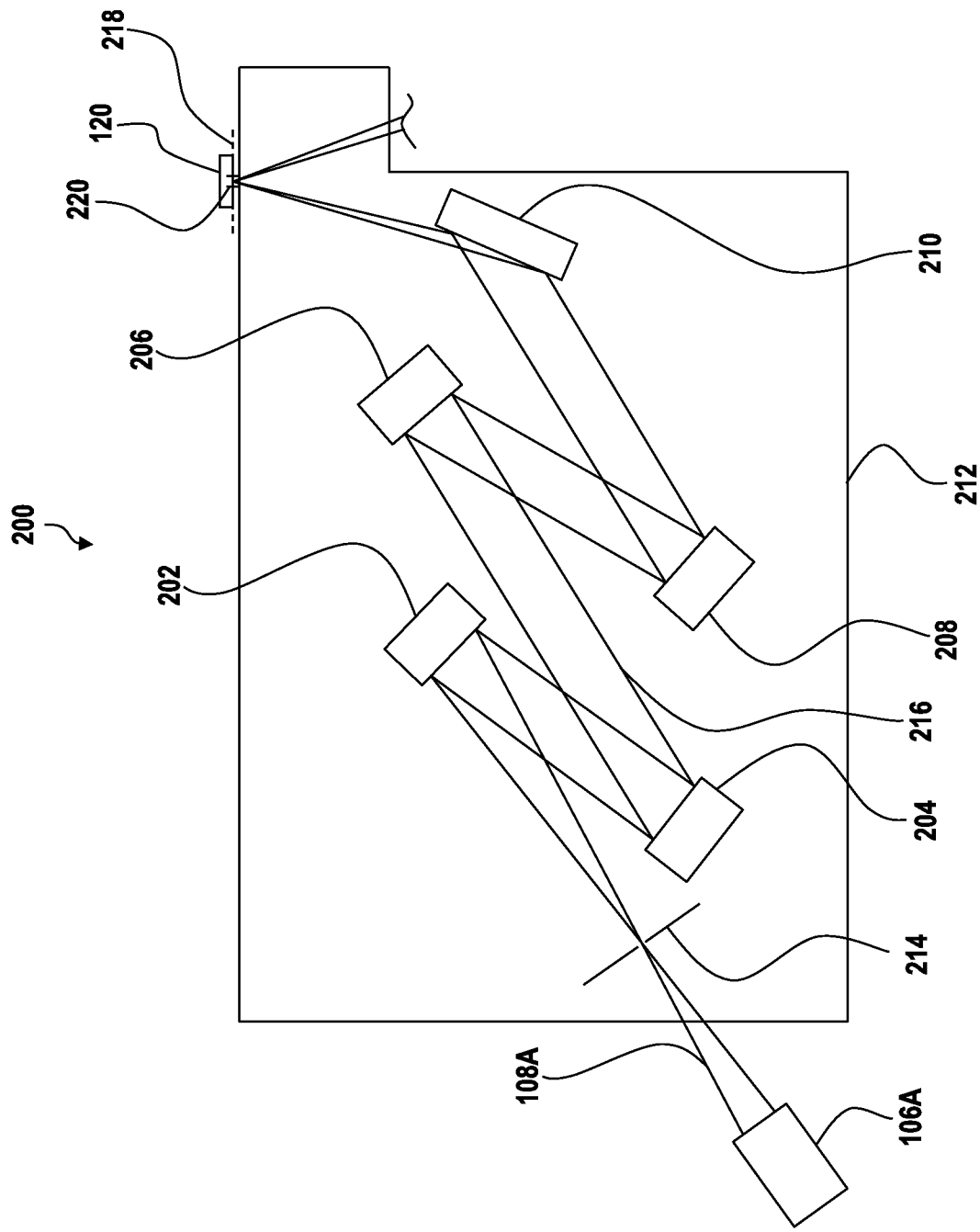
FIG. 2 shows a schematic view of one embodiment of an optical arrangement for the lithography apparatus in accordance with FIG. 1A or FIG. 1B.

FIG. 2 shows a schematic view of an optical arrangement 200. The optical arrangement 200 is a beam shaping and illumination system 102, for example a beam shaping and illumination system 102 of an EUV lithography apparatus 100A. The optical arrangement 200 can therefore also be designated as a beam shaping and illumination system and the beam shaping and illumination system 102 can be designated as an optical arrangement. The optical arrangement 200 can be disposed upstream of a projection system 104 as explained above.

However, the optical arrangement 200 can also be part of a DUV lithography apparatus 100B. However, it is assumed below that the optical arrangement 200 is part of an EUV lithography apparatus 100A. Besides the optical arrangement 200, FIG. 2 also shows an EUV light source 106A as explained above, which emits EUV radiation 108A, and a photomask 120. The EUV light source 106A can be part of the optical arrangement 200.

The optical arrangement 200 comprises a plurality of mirrors 202, 204, 206, 208. Furthermore, an optional deflection mirror 210 can be provided. The deflection mirror 210 is operated with grazing incidence and can therefore also be referred to as a grazing incidence mirror. The deflection mirror 210 can correspond to the mirror 122 shown in FIG. 1A. The mirrors 202, 204, 206, 208 can correspond to the mirrors 110, 112, 114, 116, 118 shown in FIG. 1A. For example, the mirror 202 corresponds to the mirror 110, and the mirror 204 corresponds to the mirror 112.

The mirror 202 is a so-called facet mirror, for example a field facet mirror, of the optical arrangement 200. The mirror 204 is also a facet mirror, for example a pupil facet mirror, of the optical arrangement 200. The mirror 202 reflects the EUV radiation 108A to the mirror 204. At least one of the mirrors 206, 208 can be a condenser mirror of the optical arrangement 200. The number of mirrors 202, 204, 206, 208 is arbitrary. By way of example, it is possible to provide, as shown in FIG. 1A, five mirrors 202, 204, 206, 208, namely the mirrors 110, 112, 114, 116, 118, or, as shown in FIG. 2, four mirrors 202, 204, 206, 208. However, at least three mirrors 202, 204, 206, 208 can be provided, namely a field facet mirror, a pupil facet mirror, and a condenser mirror.

A facet mirror comprises a multiplicity of lamellae or facets, which can be arranged linearly. The facets can be curved arcuately or in a crescent-shaped fashion. The facets can also be polygonal, for example quadrilateral. By way of example, a facet mirror can have hundreds to thousands of facets. Each facet can be individually tiltable.

The mirrors 202, 204, 206, 208 are arranged within a housing 212. The housing 212 can be subjected to a vacuum during operation, for example during exposure operation, of the optical arrangement 200. That is to say that the mirrors 202, 204, 206, 208 are arranged in a vacuum.

During operation of the optical arrangement 200, the EUV light source 106A emits EUV radiation 108A. By way of example, a tin plasma can be produced for this purpose. In order to produce the tin plasma, a tin body, for example a tin bead or a tin droplet, can be bombarded with a laser pulse. The tin plasma emits EUV radiation 108A, which is collected with the aid of a collector, for example an ellipsoidal mirror, of the EUV light source 106A and is sent in the direction of the optical arrangement 200. The collector focuses the EUV radiation 108A at an intermediate focus 214. The intermediate focus 214 can also be designated as an intermediate focal plane or lies in an intermediate focal plane.

Upon passing through the optical arrangement 200, the EUV radiation 108A is reflected by each of the mirrors 202, 204, 206, 208 and also the deflection mirror 210. A beam path of the EUV radiation 108A is designated by the reference sign 216. The photomask 120 is arranged in an object plane 218 of the optical arrangement 200. An object field 220 is positioned in the object plane 218.

Figure 3:
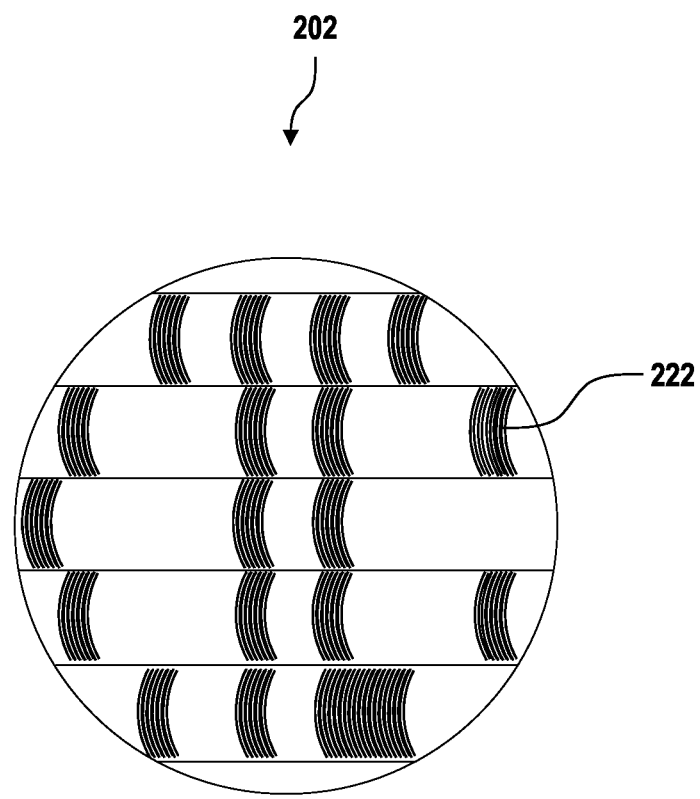
FIG. 3 shows a schematic plan view of one embodiment of a field facet mirror for the optical arrangement in accordance with FIG. 2.

FIG. 3 shows a schematic plan view of one embodiment of a mirror 202 as explained above, which mirror is in the form of a facet mirror, for example a field facet mirror. The facet mirror or field facet mirror is therefore designated hereinafter by the reference sign 202. The field facet mirror 202 comprises a multiplicity of lamellae or facets 222 arranged linearly. The facets 222 are field facets, for example, and are also designated as such hereinafter.

The field facets 222 can be curved arcuately or in a crescent-shaped fashion. The field facets 222 can also be polygonal, for example quadrilateral. For example, the field facets 222 can also have an elongated rectangular geometry in each case. Only a small number of field facets 222 are shown in FIG. 3. By way of example, the field facet mirror 202 can comprise hundreds to thousands of field facets 222. Each field facet 222 is tiltable by itself. For this purpose, an actuating element or an actuator can be assigned to each field facet 222. The actuator can be a so-called Lorentz actuator.

Figure 4:
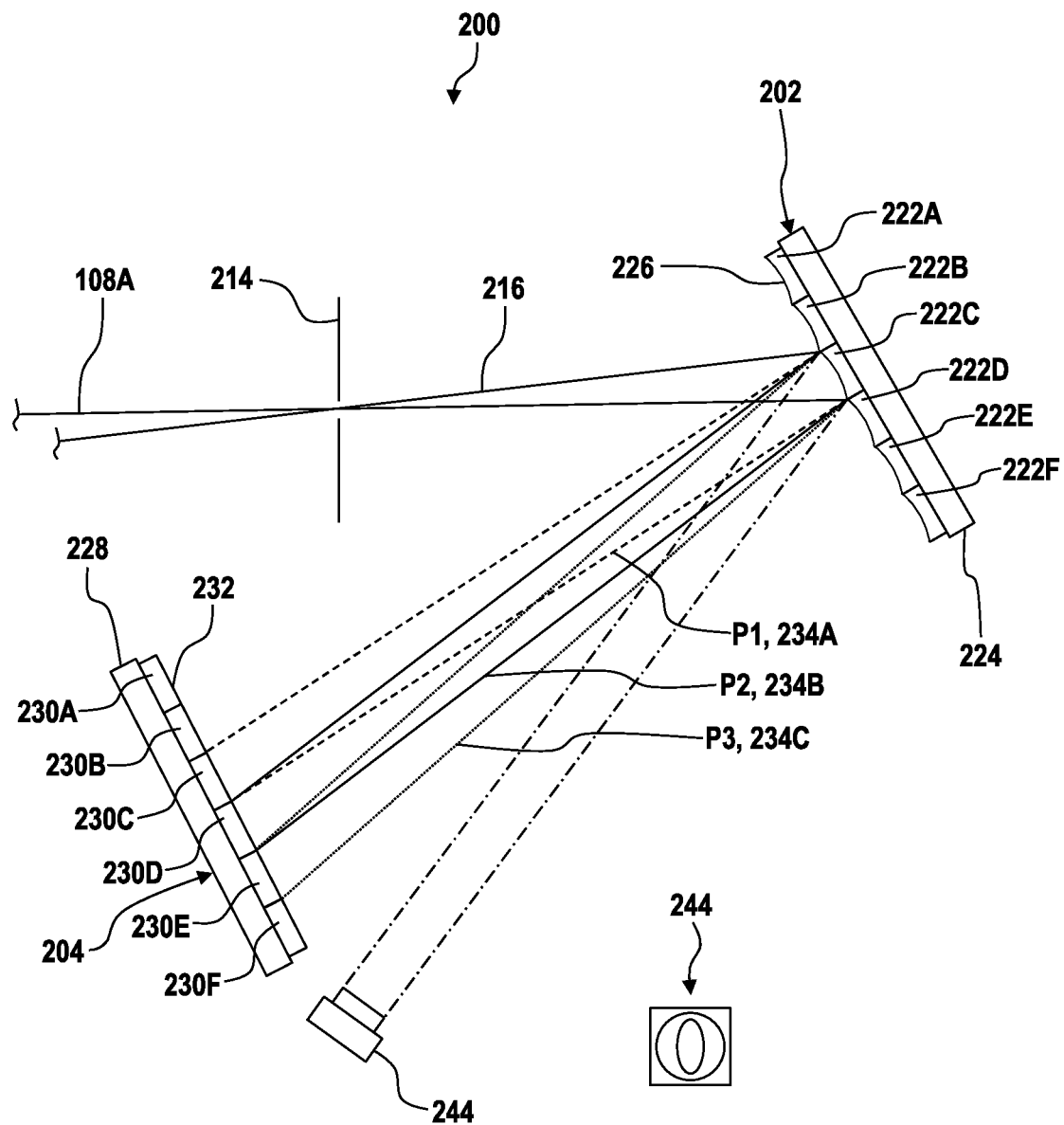
FIG. 4 shows a further schematic view of the optical arrangement in accordance with FIG. 2.

FIG. 4 shows an enlarged excerpt from the optical arrangement 200 in shown in FIG. 2. The optical arrangement 200 comprises the EUV light source 106A (not shown), which emits EUV radiation 108A, the intermediate focus 214, the field facet mirror 202 and also the mirror 204 in the form of a pupil facet mirror. The mirror 204 is designated hereinafter as a pupil facet mirror. The mirrors 206, 208, the deflection mirror 210 and the housing 212 are not shown in FIG. 4. The pupil facet mirror 204 is arranged at least approximately in an entrance pupil plane of the projection system 104 or a conjugate plane with respect thereto.

The intermediate focus 214 is an aperture stop of the EUV light source 106A. For the sake of simplicity, the description hereinafter does not draw a distinction between the aperture stop for producing the intermediate focus 214 and the actual intermediate focus, that is to say the opening in the aperture stop.

The field facet mirror 202 comprises a carrier body or main body 224, which—as mentioned above—carries a multiplicity of field facets 222A, 222B, 222C, 222D, 222E, 222F. The field facets 222A, 222B, 222C, 222D, 222E, 222F can have an identical form, but can also differ from one another, for example in the shape of their boundary and/or a curvature of a respective optically effective surface 226. The optically effective surface 226 is a mirror surface. The optically effective surface 226 serves to reflect the EUV radiation 108A in the direction towards the pupil facet mirror 204. In FIG. 4, only the optically effective surface 226 of the field facet 222A is provided with a reference sign. However, the field facets 222B, 222C, 222D, 222E, 222F likewise have such optically effective surfaces 226. The optically effective surface 226 can be designated as a field facet surface.

Only the field facet 222C is discussed below. However, all explanations concerning the field facet 222C also apply to the field facets 222A, 222B, 222D, 222E, 222F. Accordingly, only that part of the EUV radiation 108A which impinges on the field facet 222C is illustrated. However, the entire field facet mirror 202 is illuminated with the aid of the EUV light source 106A.

The pupil facet mirror 204 comprises a carrier body or main body 228, which carries a multiplicity of pupil facets 230A, 230B, 230C, 230D, 230E, 230F. Each of the pupil facets 230A, 230B, 230C, 230D, 230E, 230F has an optically effective surface 232, for example a mirror surface. In FIG. 4, only the optically effective surface 232 of the pupil facet 230A is provided with a reference sign. The optically effective surface 232 is suitable for reflecting EUV radiation 108A. The optically effective surface 232 can be designated as a pupil facet surface.

For switching over between different pupils, the field facet 222C can be switched over between different pupil facets 230A, 230B, 230C, 230D, 230E, 230F. For example, for this purpose, the pupil facets 230C, 230D, 230E are assigned to the field facet 222C. This involves tilting the field facet 222C. This tilting is effected mechanically by 25 to 40 mrad, such that the EUV radiation 108 is deflected by 50 to 80 mrad in accordance with the condition that the angle of incidence is equal to the angle of reflection. This angle indication relates to a half-angle, that is to say measured from the centre to the edge rather than from one (left) edge to the other (right) edge.

The field facet 222C—as mentioned above—is tiltable with the aid of an actuator (not illustrated), for example with the aid of a Lorentz actuator, between a plurality of positions or tilt positions P1, P2, P3. In a first tilt position P1, the field facet 222C images the intermediate focus 214 onto the pupil facet 230C with an imaging light beam 234A (illustrated by dashed lines). In a second tilt position P2, the field facet 222C images the intermediate focus 214 onto the pupil facet 230D with an imaging light beam 234B (illustrated by solid lines). In a third tilt position P3, the field facet 222C images the intermediate focus 214 onto the pupil facet 230E with an imaging light beam 234C (illustrated by dotted lines). The respective pupil facet 230C, 230D, 230E images the field facet 222C onto the photomask 120 (not illustrated here) or in proximity thereto.

In each of the tilt positions P1, P2, P3, the imaging light beam 234A, 234B, 234C irradiates a portion of the optically effective surfaces 232 of the pupil facets 230C, 230D, 230E assigned to the respective tilt position P1, P2, P3. The effect of switching over between the tilt positions P1, P2, P3 and irradiating the optically effective surfaces 232 of the pupil facets 230C, 230D, 230E is described in greater detail below with reference to FIGS. 5 and 6.

Figure 5:
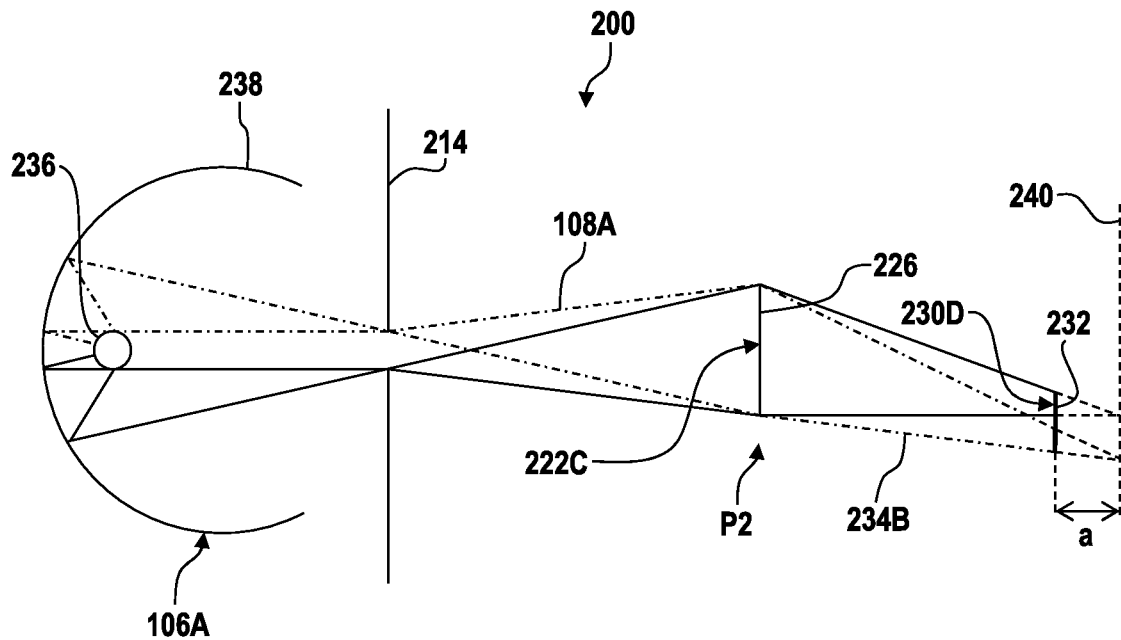
FIG. 5 shows a further schematic view of the optical arrangement in accordance with FIG. 2.
Figure 6:
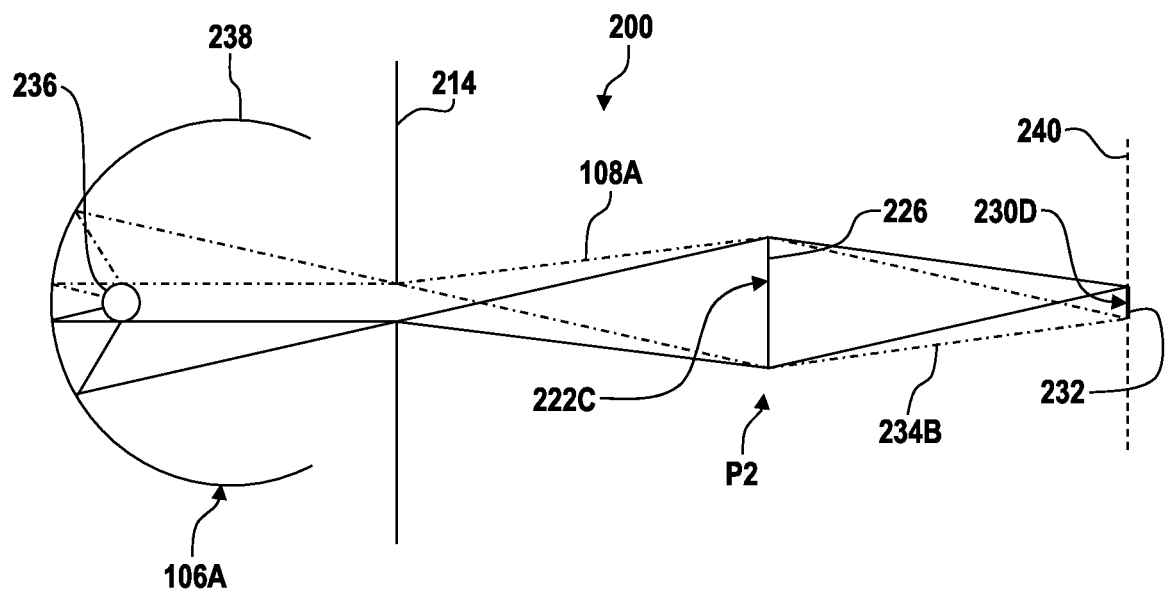
FIG. 6 shows a further schematic view of the optical arrangement in accordance with FIG. 2.

FIGS. 5 and 6 show further illustrations of the optical arrangement 200 in accordance with FIG. 4. In FIGS. 5 and 6, the EUV light source 106A, the intermediate focus 214, the field facet 222C and the pupil facet 230D are illustrated in a line to facilitate the illustration. In actual fact, however, as shown in FIG. 2, they are thus arranged at specific angles with respect to one another. FIG. 5 shows the field facet 222C in its tilt position P2, wherein a curvature of the optically effective surface 226 was not altered and, for example, was not adapted to the tilt position P2. As illustrated in FIGS. 5 and 6, the EUV light source 106A comprises a plasma source 236 for generating the EUV radiation 108A and a collector 238 for focusing the EUV radiation 108A. The intermediate focus 214 and the pupil facet 230D are typically round. The pupil facet 230D can also be hexagonal.

The field facet 222C projects an image of the intermediate focus 214 onto the pupil facet 230D with the imaging light beam 234B. However, the optically effective surface 232 of the pupil facet 230D does not correspond exactly to an imaging surface 240 in which the image of the intermediate focus 214 is perfectly focused. Instead, the optically effective surface 232 of the pupil facet 230D in FIG. 5 is nearer to the field facet 222C than the imaging surface 240, such that the imaging of the intermediate focus 214 onto the pupil facet 230D with the imaging light beam 234B is not focused. There is a distance a between the optically effective surface 232 of the pupil facet 230D and the imaging surface 240.

This defocusing gives rise to a limitation in the reduction of the degree of pupil filling. However, in order to achieve ever higher resolutions of EUV lithography optical units, it is desirable to further reduce the degree of pupil filling. In the case of a defocused image of the intermediate focus 214 on one of the pupil facets 230A, 230B, 230C, 230D, 230E, 230F, the pupil facet are made larger than actually necessary, as a result of which a larger area of the pupil facet mirror 204, that is to say a larger illuminated area, is illuminated.

The ratio of irradiated area relative to the entire optically effective surface 232 of the pupil facets 230A, 230B, 230C, 230D, 230E, 230F des of the pupil facet mirror 204 (that is to say to the area that can be maximally accommodated by the EUV lithography apparatus 100A, is designated as the "degree of pupil filling". Usually, small unfilled regions, for example regions that are smaller than the area of a pupil facet, within an otherwise filled region are concomitantly included in the calculation of the degree of pupil filling.

Figure 7:
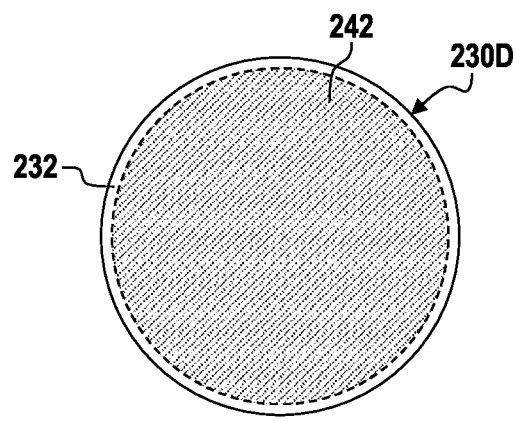
FIG. 7 shows a schematic view of one embodiment of a pupil facet of a pupil facet mirror for the optical arrangement in accordance with FIG. 2.
Figure 8:
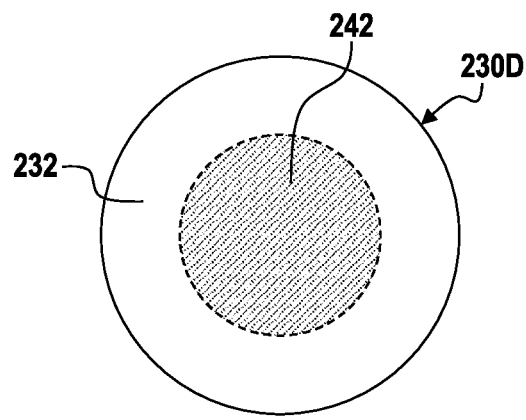
FIG. 8 shows a further schematic view of the pupil facet in accordance with FIG. 7.
Figure 9:
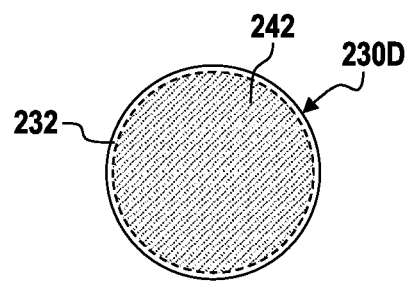
FIG. 9 shows a schematic view of a further embodiment of a pupil facet of a pupil facet mirror for the optical arrangement in accordance with FIG. 2.

This non-focused image is characterized by the fact that an area 242 irradiated by the imaging light beam 234B, the area being illustrated in a hatched manner in FIGS. 7 to 9, is relatively large. This is owing to the fact that the curvature of the optically effective surface 226 of the field facet 222C was not optimized. FIG. 7 shows a plan view of the optically effective surface 232 of the pupil facet 230D. The optically effective surface 232 is substantially round or hexagonal. Consequently, the pupil facet 230D can also be round or hexagonal. The area 242 of the optically effective surface 232 of the pupil facet 230D that is irradiated by the imaging light beam 234B corresponds, in terms of its extents, approximately to the optically effective surface 232 itself. The irradiated area 242 thus covers almost the entire optically effective surface 232 of the pupil facet 230D.

FIG. 6 shows the field facet 222C in the tilt position P2 after an alteration of the curvature of the optically effective surface 226. In FIG. 6, the curvature of the optically effective surface 226 was changed in such a way that the distance a between the optically effective surface 232 and the imaging surface 240 is reduced. In FIG. 6, the distance a is zero, such that the optically effective surface 232 and the imaging surface 240 lie one above the other. The imaging of the intermediate focus 214 onto the pupil facet 230D with the imaging light beam 234B is perfectly focused in FIG. 6 and the irradiated area 242 is significantly reduced in terms of its extents—as shown in FIG. 8—by comparison with the irradiated area 242 in FIG. 7.

FIG. 8 shows a further plan view of the optically effective surface 232 of the pupil facet 230D. As illustrated in FIG. 8, the irradiated area 242 is significantly reduced by comparison with the irradiated area 242 illustrated in FIG. 7 before the alteration of the curvature of the optically effective surface 226 of the field facet 222C.

As shown in a further plan view in FIG. 9, the possibility is afforded of reducing the size of the pupil facets 230A, 230B, 230C, 230D, 230E, 230F and packing them more closely. The resolution of the EUV lithography apparatus 100A can be increased as a result. The reduced optically effective surface 232 of the pupil facets 230A, 230B, 230C, 230D, 230E, 230F is round or hexagonal. The irradiated area 242 illustrated in a hatched manner is identical to that in FIG. 8 in terms of its extents, but fills a large portion of the optically effective surface 232 of the pupil facet 230D illustrated in FIG. 9. The optimization of the curvature of the optically effective surface 226 of the field facet 222C thus makes it possible to reduce the size of the pupil facet 230D.

A description is given below of how the curvature of the curved optically effective surface 226 of the field facet 222C is altered in order always to achieve a focusing onto the respective pupil facet 230C, 230D, 230E and/or in order to reduce the irradiated area 242, as explained above. At the same time—as will also be explained below—sufficient robustness to withstand thermal disturbances can be achieved.

Figure 10:
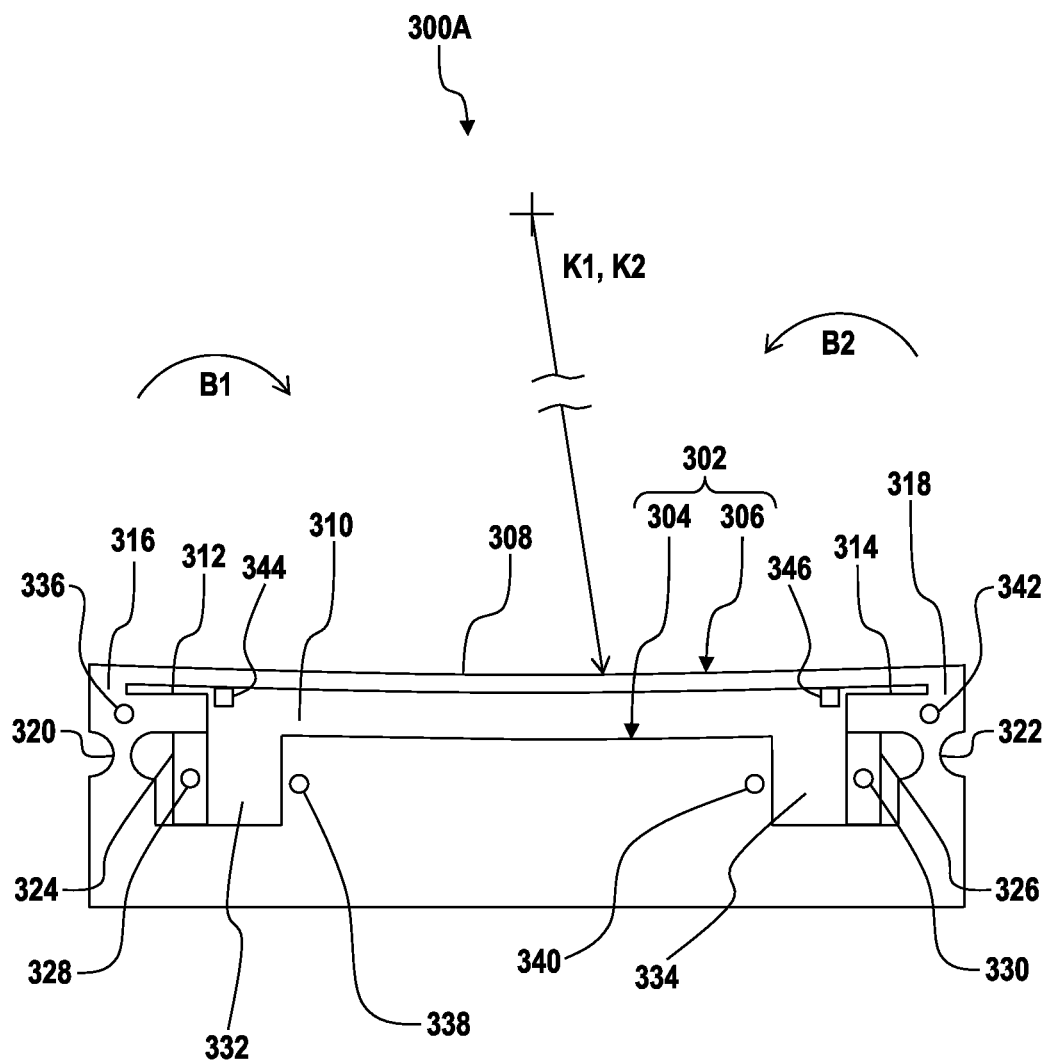
FIG. 10 shows a schematic view of one embodiment of an optical system for the optical arrangement in accordance with FIG. 2.

FIG. 10 shows a schematic view of one embodiment of an optical system 300A. The optical system 300A is part of an optical arrangement 200 as explained above. For example, the optical arrangement 200 can comprise a multiplicity of such optical systems 300A. The optical system 300A is, for example, also part of a field facet mirror 202 as explained above. The optical system 300A is a field facet 222A, 222B, 222C, 222D, 222E, 222F as explained above. The optical system 300A can therefore also be designated as a field facet, field facet system or field facet device. The optical system 300A can be a field facet system. Hereinafter, however, the field facet system is designated as optical system 300A.

A coordinate system having a first spatial direction or x-direction x, a second spatial direction or y-direction y and a third spatial direction or z-direction z is assigned to the optical system 300A. The spatial directions x, y, z are positioned perpendicularly to one another. The x-direction x can also be referred to as the width direction. The y-direction y can also be referred to as the length direction or longitudinal direction. The z-direction z can also be referred to as the vertical direction or thickness direction.

The optical system 300A comprises an optical element 302. The optical element 302 is produced from a mirror substrate or substrate. The substrate can comprise for example copper, for example a copper alloy, an iron-nickel alloy, such as Invar, for example, silicon or some other suitable material. The substrate is responsible for the mechanical properties of the optical element 302.

The optical system 302 comprises a main body 304 and a facet portion 306. The facet portion 306 can also be referred to as a facet or an optical facet. The facet portion 306 can have an arcuately curved or crescent-shaped geometry in plan view. However, the facet portion 306 can also have an elongated rectangular geometry in plan view. The main body 304 and the facet portion 306 are embodied integrally, for example materially in one piece. In this case, "in one piece" or "integrally" means that the main body and the facet portion 306 form a common component and are not composed of different component parts. "Materially in one piece" means that the main body 304 and the facet portion 306 are manufactured from the same material throughout.

An optically effective surface 308 is provided on the front side at the optical element 302, that is to say at the facet portion 306. The optically effective surface 308 corresponds to the optically effective surface 226 in accordance with FIG. 4. The optically effective surface 308 is a mirror surface. The optically effective surface 308 can be produced with the aid of a coating. The optically effective surface 308 can be applied as a coating to the substrate. A polishing layer can be provided between the substrate and the optically effective surface 308. The optical element 302 is a mirror facet or can be designated as such.

The optically effective surface 308 or the facet portion 306 comprises a first radius of curvature K1. The first radius of curvature K1 indicates a curvature of the optically effective surface 308 in a plane spanned by the y-direction y and the z-direction z. The optically effective surface 308 or the facet portion 306 can furthermore have a second radius of curvature K2. The second radius of curvature K2 is oriented perpendicularly to the first radius of curvature K1. This results in a toroidal shape for the optically effective surface 308. The second radius of curvature K2 indicates a curvature of the optically effective surface 308 in a plane spanned by the x-direction x and the z-direction z A gap 310 is provided between the facet portion 306 and the main body 304. The facet portion 306 has two lever arms 312, 314, which are connected to the facet portion 306 in one piece, for example materially in one piece, via connecting regions 316, 318. The gap 310 extends between the facet portion 306 and the lever arms 312, 314. The connecting regions 316, 318 each constitute a cross-sectional constriction provided between the facet portion 306 and the lever arms 312, 314.

The lever arms 312, 314 in turn are connected to the main body 304 in one piece, for example materially in one piece, via joint portions 320, 322. The joint portions 320, 322 are embodied as so-called flexures. In the present case, a "flexure" should be understood to mean a region of a component which, by bending, allows a relative movement between two rigid body regions. The joint portions 320, 322 are elastically deformable. In this case, a first joint portion 320 and a second joint portion 322 are provided. The first joint portion 320 enables a movement of the facet portion 306 about an axis arranged parallel to the x-direction x. The second joint portion 322 likewise enables a movement of the facet portion 306 about an axis parallel to the x-direction x.

The optical system 300A comprises actuating elements 324, 326. The actuating elements 324, 326 can also be designated as actuators. The actuating elements 324, 326 are linear actuating elements, for example linear piezoelements. That is to say that the actuating elements 324, 326 can become shorter and longer depending on control. Two actuating elements 324, 326 can be provided. The number of actuating elements 324, 326 is however arbitrary in principle. The actuating elements 324, 326 are piezoactuating elements or piezoactuators. However, it is also possible to use any other actuators for the actuating elements 324, 326.

A temperature sensor 328, 330 is assigned to each actuating element 324, 326. A temperature of the respective actuating element 324, 326 is detectable with the aid of the temperature sensors 328, 330. The actuating elements 324, 326 are accommodated in recesses 332, 334 provided within the main body 304.

Furthermore, the optical system 300A has temperature sensors 336, 338, 340, 342 which can be positioned in corresponding recesses in the main body 304. Furthermore, the optical system 300A can have displacement measuring sensors 344, 346, with the aid of which a deformation of the facet portion 306 is detectable.

The functionality of the optical system 300A is explained below. The facet portion 306 is connected to the main body 304 via the joint portions 320, 322 and the lever arms 312, 314 arranged at both ends of the facet portion 306. For the purpose of actuating the facet portion 306, the actuating elements 324, 326 are controlled in such a way that they experience shortening, namely along the z-direction z. As a result, the lever arms 312, 314 are pulled downward along the z-direction z in the orientation in FIG. 10.

The lever arms 312, 314 pivot about the joint portions 320, 322 and two oppositely oriented bending moments B1, B2 are applied to the facet portion 306 in order to deform the facet portion 306. A first bending moment B1 is oriented in the clockwise direction. A second bending moment B2 is oriented in the counterclockwise direction. At least the first radius of curvature K1 changes in the process. Depending on the arrangement of the actuating elements 324, 326, the second radius of curvature K2 can also change.

A heat input into the optical system 300A takes place primarily via the facet portion 306, and the heat removal via a base of the main body 304. An inhomogeneous temperature distribution will therefore be established in the optical system 300A. In order to compensate for nonuniform heating of the optical element 302, the temperature distribution in the optical system 300A can be detected by way of the temperature sensors 328, 330, 336, 338, 340, 342 and from that, by way of an external control unit 348, to detect a deformation state of the optical system 300A, to calculate a corresponding correction signal and to apply the latter to the actuating elements 324, 326.

The temperature sensors 328, 330, 336, 338, 340, 342 can detect the temperature of each individual actuating element 324, 326 and also the temperature of those regions of the main body 304 and of the lever arms 312, 314 which are relevant to the disturbing effect. Embodiments of the temperature sensors 328, 330, 336, 338, 340, 342 may be NTC sensors (Negative Temperature Coefficient, NTC), thermocouples, platinum sensors or themopiles. Thermopiles enable positioning of the measuring element in the main body 304 with a contactless temperature measurement of the facet portion 306.

Alternatively or additionally, the actual deformation of the facet portion 306 can be detected with the aid of the displacement measuring sensors 344, 346 and a correction signal for the actuating elements 324, 326 can be calculated therefrom by way of the external control unit 348. With this procedure it is possible that further faults such as, for example, a hysteresis of the actuating elements 324, 326, mechanical drift effects and creep effects of the actuating elements 324, 326 or an electrical drift of the control unit 348 can be detected and compensated for.

In the case where the displacement measuring sensors 344, 346 are provided, the arrangement of at least two displacement measuring sensors 344, 346 at the same distance from an outer edge of the facet portion 306 can be desirable. Furthermore, the choice of a displacement measuring system which is as insensitive to temperature change as possible can be desirable. The displacement measurement can be effected either directly by way of a change in distance between the facet portion 306 and the main body 304 or by way of the expansion of the facet portion 306 or of the lever arms 312, 314.

Embodiments of direct displacement measuring sensors 344, 346 may be capacitive or inductive sensors on account of the severely limited installation space. The use of confocal optical sensors can be desirable with regard to the least possible temperature sensitivity. The use of the actuating elements 324, 326 in a closed control loop taking account of the correction signals from displacement measurement and temperature measurement can be desirable with regard to the fullest possible fault compensation.

For specific applications of the optical system 300A, it may be desirable to set mutually independent, different radii of curvature for different length portions of the facet portion 306. This may be desirable for example in order to be able to compensate for inaccuracies or faults during the production of the optically effective surface 308. The facet portion 306 is embodied in comparatively thin fashion. As a result, during the polishing of the optically effective surface 308, the forces acting on the facet portion 306 during the polishing process can result in a deformation of the facet portion 306 which influences the accuracy of the polishing process. This can result in a wavy deviation between a cylindrical or toric target contour and an actual contour actually produced.

Figure 11:
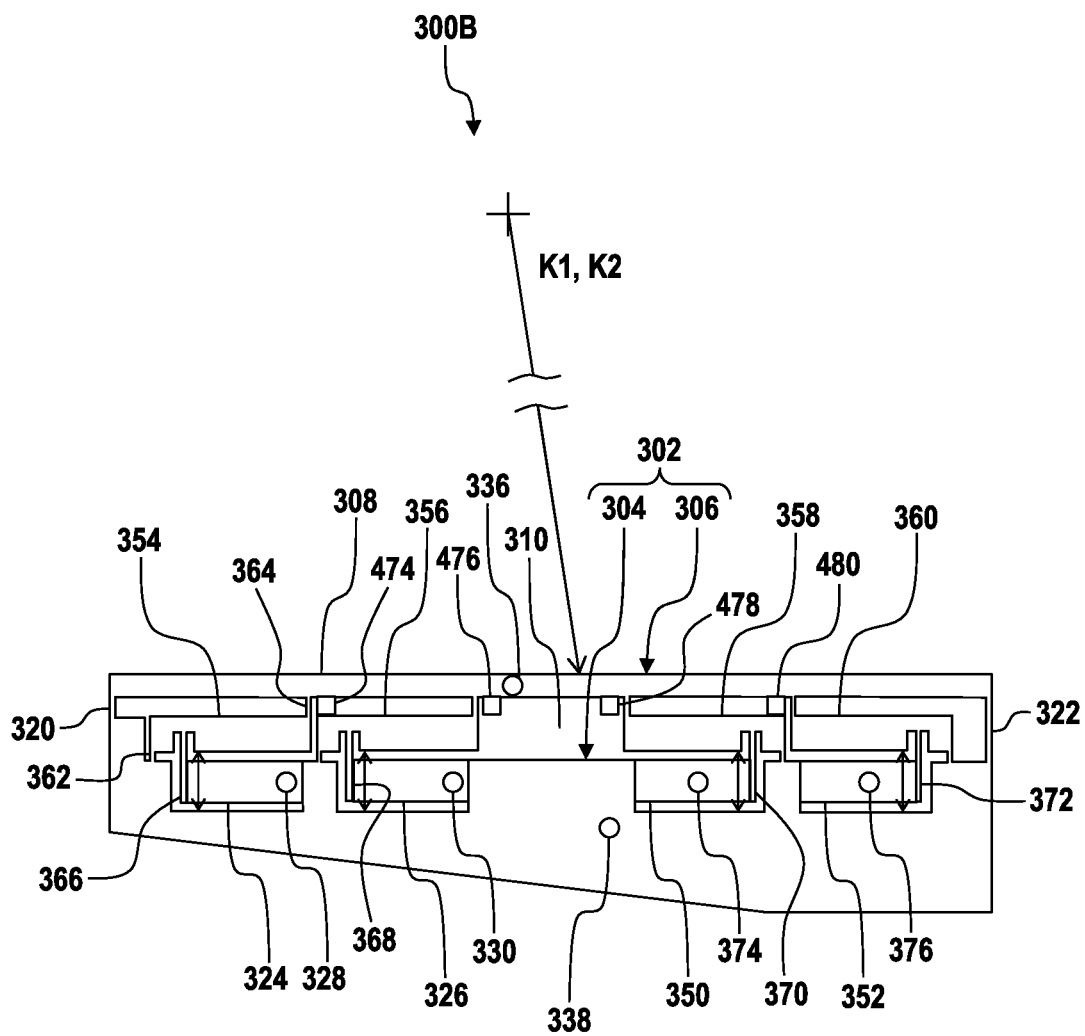
FIG. 11 shows a schematic view of a further embodiment of an optical system for the optical arrangement in accordance with FIG. 2.

FIG. 11 shows a schematic view of a further embodiment of an optical system 300B. Only differences between the optical systems 300A, 300B are discussed below.

The optical system 300B comprises actuating elements 324, 326, 350, 352, which, in contrast to the optical system 300A, are not embodied as a linear actuating elements, but rather as shear actuating elements, for example as shear piezoactuators. In the orientation in FIG. 12, these actuating elements 324, 326, 350, 352 can curve upward and downward, as is indicated with the aid of an arrow. The actuating elements 324, 326, 350, 352 are arranged one behind another or next to one another as viewed along the y-direction y.

A lever arm 354, 356, 358, 360 is assigned to each actuating element 324, 326, 350, 352. Each lever arm 354, 356, 358, 360, as shown on the basis of the lever arm 354, is connected firstly to the main body 304 and secondly to the facet portion 306 with the aid of two joint portions 362, 364. The joint portions 362, 364 are provided in each case on the end sides at the respective lever arm 354, 356, 358, 360. The joint portions 362, 364 are flexures.

Via decoupling joints 366, 368, 370, 372, the actuating elements 324, 326, 350, 352 are operatively connected to the lever arms 354, 356, 358, 360. Each decoupling joint 366, 368, 370, 372 comprises two interconnected leaf springs which are flexurally pliant in the horizontal direction, i.e. along the y-direction y, and hence cannot actually transmit any or approximately any forces along the y-direction y. However, force transmission is possible in the vertical direction, that is to say along the z-direction z, in order to deform the facet portion 306. The decoupling joints 366, 368, 370, 372 also bring about a thermal decoupling. Therefore, the decoupling joints 366, 368, 370, 372 can also be referred to as thermal decouplings. A displacement measuring sensor 474, 476, 478, 480 is assigned to each lever arm 354, 356, 358, 360. A temperature sensor 328, 330, 374, 376 is assigned to each actuating element 324, 326, 350, 352.

The functionality of the optical system 300B is explained below. Using the deflection of an actuating element 324, 326, 350, 352 downward for example in the orientation in FIG. 11, via the respective lever arm 354, 356, 358, 360 an intensified tensile force is exerted downward on the facet portion 306. The latter is supported with respect to the main body 304 by way of the joint portions 320, 322. The force that can be set by way of the respective actuating element 324, 326, 350, 352 brings about a change in curvature of the facet portion 306. A multiple-wave curvature of the facet portion 306 can be set by way of varying control of the actuating elements 324, 326, 350, 352.

Figure 12:
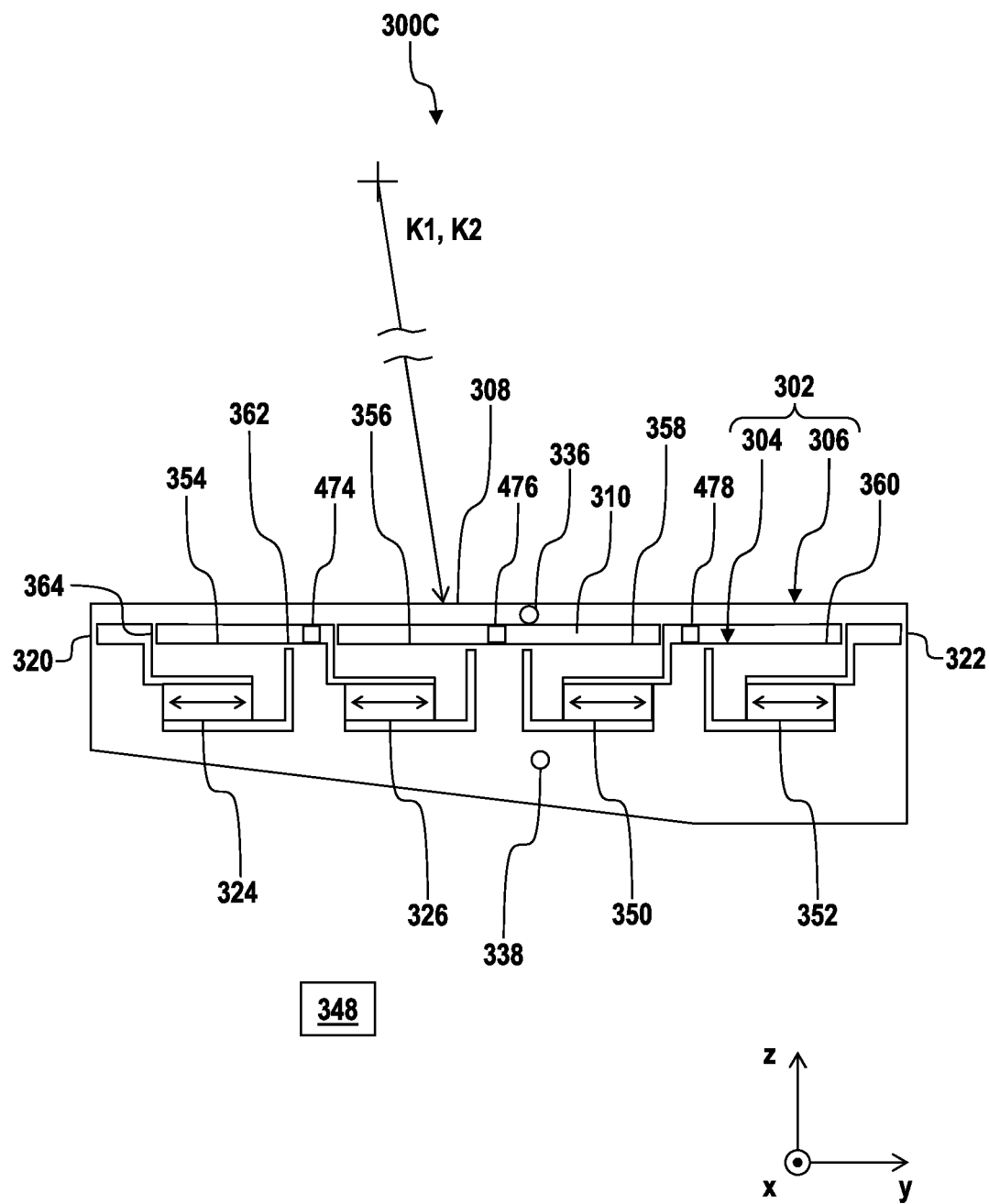
FIG. 12 shows a schematic view of a further embodiment of an optical system for the optical arrangement in accordance with FIG. 2.

FIG. 12 shows a schematic view of a further embodiment of an optical system 300C. Only differences between the optical systems 300B, 300C are discussed below.

The optical system 300C comprises actuating elements 324, 326, 350, 352, which are not embodied as shear actuating elements, but rather as linear actuating elements. That is to say that the actuating elements 324, 326, 350, 352 can become shorter and longer along their longitudinal direction, that is to say along the y-direction y. As in the case of the optical system 300B, a lever arm 354, 356, 358, 360 is assigned to each actuating element 324, 326, 350, 352, and is in each case operatively connected to the main body 304 with the aid of a joint portion 362 and to the facet portion 306 with the aid of a joint portion 364. The actuating elements 324, 326, 350, 352 can exert a tensile force or compressive force on the lever arms 354, 356, 358, 360.

Via the corresponding lever arm 354, 356, 358, 360, the change in length of the respective actuating element 324, 326, 350, 352 is converted into a tensile force or compressive force in the vertical direction, that is to say along and counter to the z-direction z, on the facet portion 306. Here, too, a multiple-wave curvature of the facet portion 306 can be set by way of varying control of the actuating elements 324, 326, 350, 352. The temperature sensors 336, 338 and displacement measuring sensors 474, 476, 478 are arranged according to the embodiment of the optical system 300B in accordance with FIG. 11. As already explained with reference to the optical system 300B, temperature sensors (not shown) can be assigned to the actuating elements 324, 326, 350, 352 as well.

Figure 13:
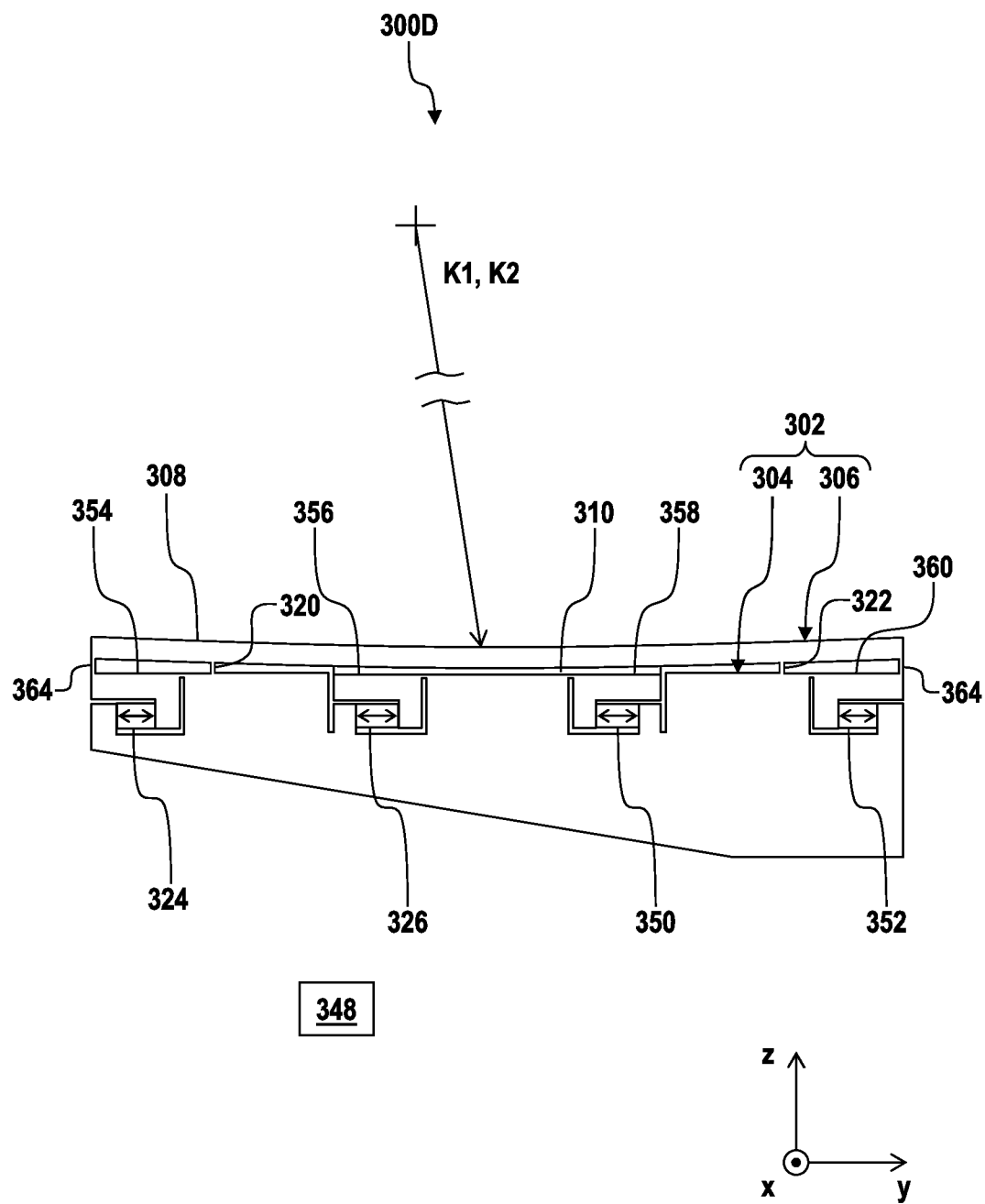
FIG. 13 shows a schematic view of a further embodiment of an optical system for the optical arrangement in accordance with FIG. 2.

FIG. 13 shows a schematic view of a further embodiment of an optical system 300D. Only differences between the optical systems 300C, 300D are discussed below.

The optical system 300D corresponds to the optical system 300C with the difference that, in the case of the optical system 300D, the joint portions 320, 322 are not provided marginally at the facet portion 306, rather the joint portions 320, 322 have been shifted inward as viewed along the y-direction y. The optical system 300D likewise has temperature sensors and displacement measuring sensors (not shown).

Figure 14:
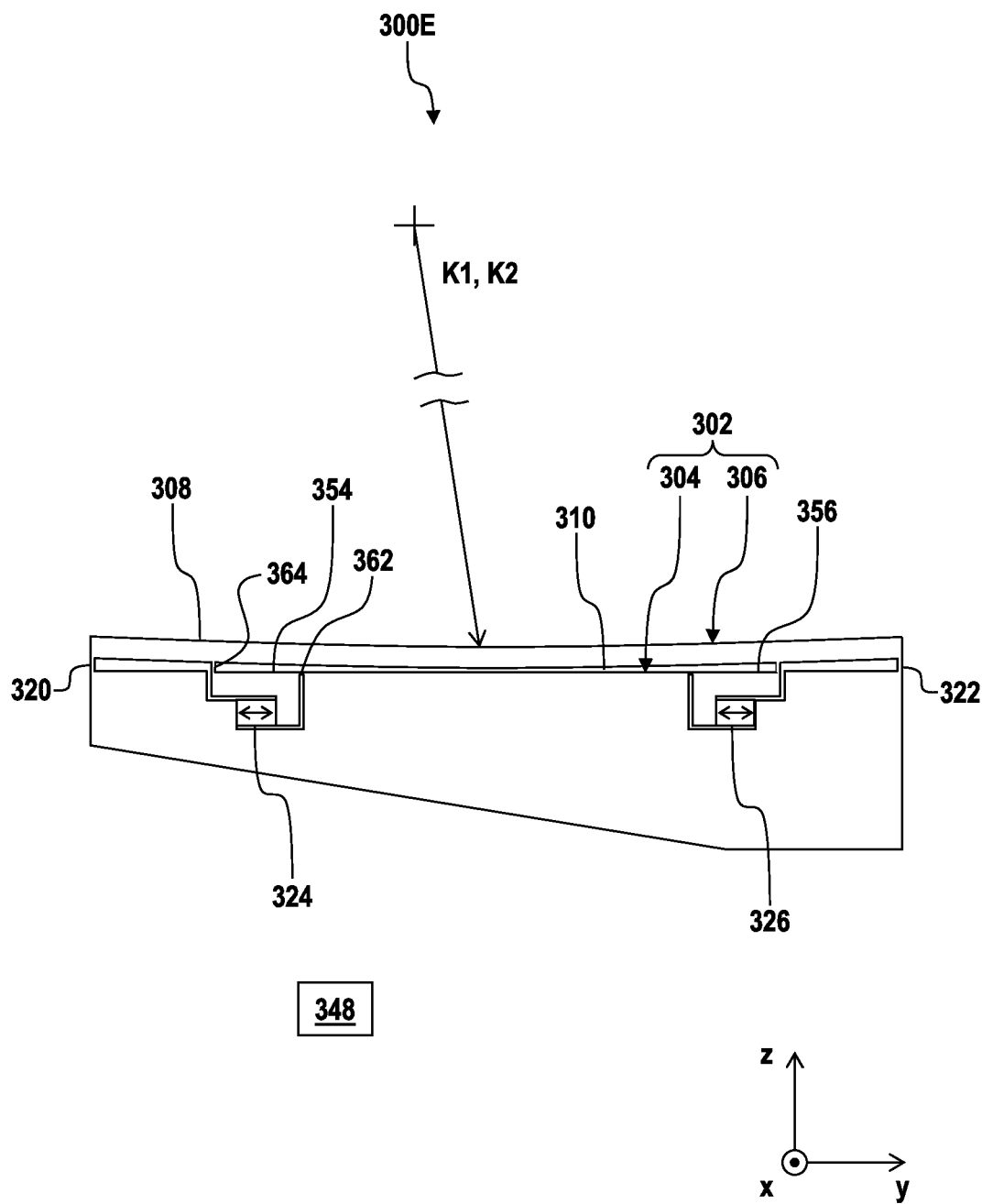
FIG. 14 shows a schematic view of a further embodiment of an optical system for the optical arrangement in accordance with FIG. 2.

FIG. 14 shows a schematic view of a further embodiment of an optical system 300E. Only differences between the optical systems 300D, 300E are discussed below.

In contrast to the optical system 300D, the optical system 300E has only two actuating elements 324, 326, rather than four. Furthermore, the joint portions 320, 322 are provided marginally at the facet portion 306. The optical system 300E likewise has temperature sensors and displacement measuring sensors (not shown).

For all the abovementioned embodiments of the optical system 300A, 300B, 300C, 300D, 300E, the main body 304 and the facet portion 306 can be produced materially in one piece or monolithically, that is to say from one raw material without further joining points. For these embodiments of the optical system 300A, 300B, 300C, 300D, 300E, it is thus possible to use the same material for kinematics, such as the joint portions 320, 322, for example, and the facet portion 306. Copper, silicon, silicon carbide (SiSiC) or cordierite can be suitable as materials.

Alternatively, the main body 304 and the facet portion 306 may be able to be produced in separate methods and to be connected to one another via a suitable joining method at the joint portions 320, 322 or the like. Different manufacturing processes can be desirable on account of the different desired functional properties made of both components. By way of example, one desired property of the facet portion 306 is the least possible inherent stress. That can be achieved for example via milling or erosion with a subsequent heat treatment. By way of example, one desired property of the main body 304 is that the fine structures such as are desired for the lever arms 312, 314 or the joint portions 320, 322, for example, be produced in the most exact way possible. The structures can be attained via erosion, etching or additive manufacturing and a different heat treatment.

In the last-mentioned case, a method for connecting the main body 304 and the facet portion 306, for example at the joint portions 320, 322, is thus used. The facet portion 306 can be connected to the main body 304 for example via welding, wringing, soldering, adhesive bonding, diffusion welding, electron beam welding, laser welding or reactive bonding. For these embodiments of the connection at the joint portions 320, 322, it is possible for inherent stresses or deformations of the joining point to become imprinted on the optically effective surface 308 and worsen the optical properties thereof. A correction of the surface defect of the optically effective surface 308 after the connection has been established can be desirable for this purpose. This can be done by mechanical, electrochemical or electron beam optical methods.

Piezoactuating elements or piezoactuators are proposed as actuating elements 324, 326, 350, 352 for all the abovementioned embodiments of the optical system 300A, 300B, 300C, 300D, 300E. Alternatively, however, the facet portion 306 can also be actuated by magnetic, magnetostrictive, pneumatic or hydraulic drives. Piezoactuators can have a very good force/installation space ratio. That is to say large deformations of the optically effective surface 308 can be achieved within the confines of the available, very limited installation space. A width of the facet portion 306 can be chosen to be very narrow on account of the small structural size of piezoactuators. As a result, a large number of optical systems 300A, 300B, 300C, 300D, 300E with actuable facet portions 306, and hence optical channels, can be arranged in the beam shaping and illumination system 102. This can be desirable for the optical performance of the beam shaping and illumination system 102.

Further, in contrast to other actuators, piezoactuators involve hardly any power during steady-state or quasi-steady-state operation. On account of the high internal resistance, the power used for the piezoactuator to hold a position is negligibly small and is mainly determined by the external wiring. The piezoactuator can maintain its position after the power supply was disconnected. This reduces the power consumption, and hence self-heating, and is suitable for reducing the thermally induced faults mentioned above.

Figure 15:
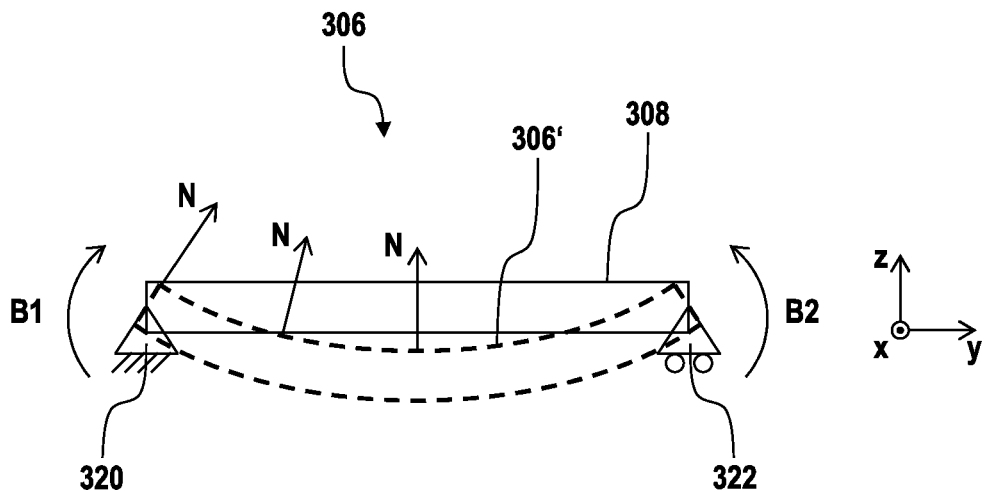
FIG. 15 shows a schematic side view of an embodiment of a facet portion for an optical system of the optical arrangement in accordance with FIG. 2.
Figure 16:
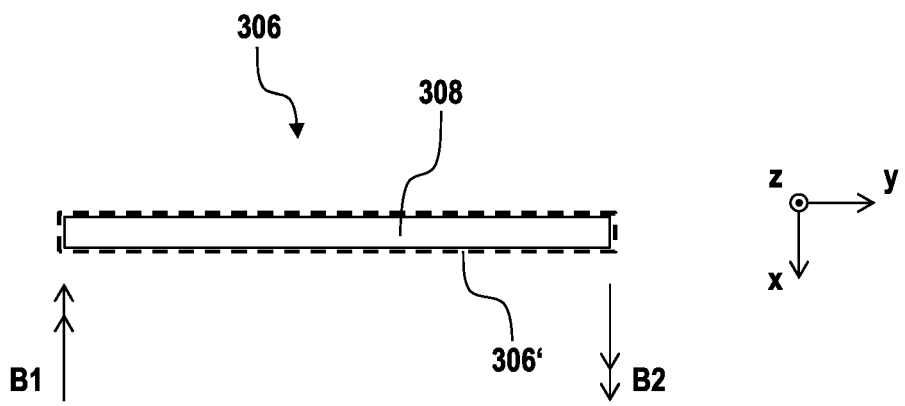
FIG. 16 shows a schematic view of the facet portion in accordance with FIG. 15.
Figure 17:
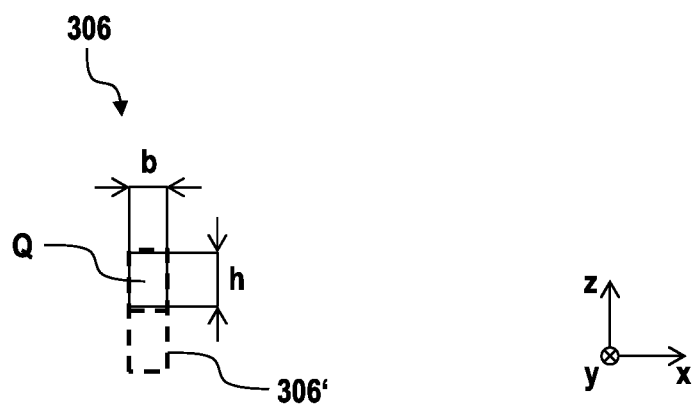
FIG. 17 shows a schematic front view of the facet portion in accordance with FIG. 15.

FIGS. 15 to 17 show greatly simplified schematic views of one embodiment of a facet portion 306. FIG. 15 shows a side view of the facet portion 306. FIG. 16 shows a plan view of the facet portion 306. FIG. 17 shows a front view of the facet portion 306. Viewed in simplified terms, the optical systems 300A, 300B, 300C, 300D, 300E are based on the kinematic principle of a bending beam which forms the facet portion 306 and which is supported on both sides, with bending moments B1, B2 being introduced on both sides. FIG. 15 shows the bending beam in the form of the facet portion 306 in a non-deformed state, shown in solid lines, and in a deformed state, shown in dashed lines. In the deformed state, the facet portion is denoted by reference sign 306'.

According to a possible embodiment, a facet portion 306 that is straight in the y-direction y (long axis of the facet portion 306) corresponds to a straight bending beam. The facet portion 306 has a width b and a height h, both of which are constant when viewed along the y-direction y. Such a facet portion 306 with a homogeneous cross section Q will deform exclusively in a plane spanned by the y-direction y and the z-direction z when oppositely directed bending moments B1, B2 are introduced on both sides. As a result, a surface normal or a normal vector N of the optically effective surface 308 experiences exclusively a rotation about the x-direction x (short axis of the facet portion 306), depending on its position in the y-direction y on the facet portion 306.

Figure 18:
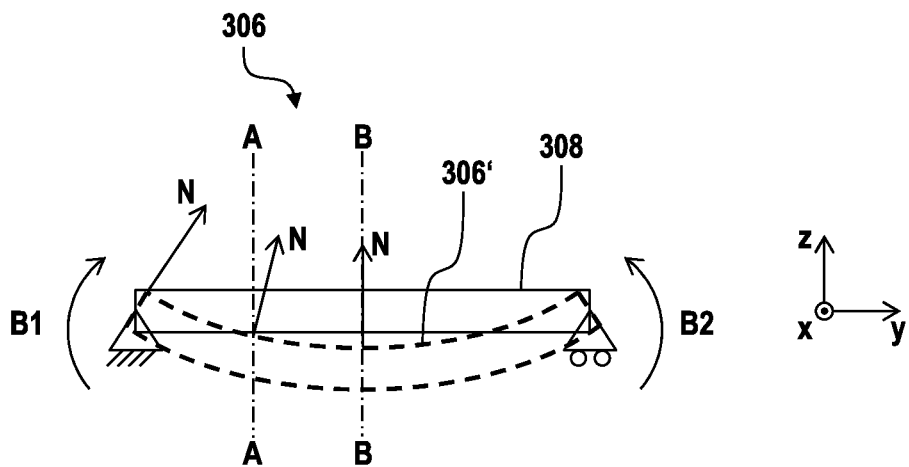
FIG. 18 shows a schematic side view of a further embodiment of a facet portion for an optical system of the optical arrangement in accordance with FIG. 2.
Figure 19:
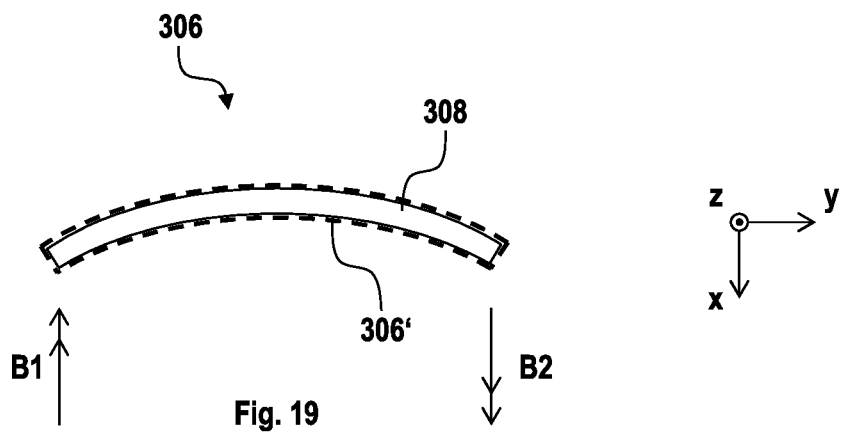
FIG. 19 shows a schematic view of the facet portion in accordance with FIG. 18.
Figure 20:
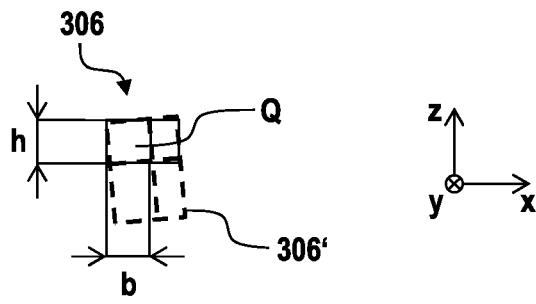
FIG. 20 shows a schematic sectional view of the facet portion in accordance with the sectional line A-A in FIG. 18.
Figure 21:
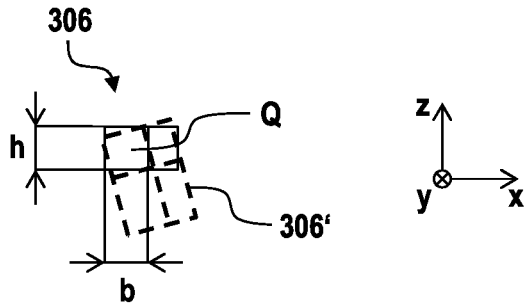
FIG. 21 shows a further schematic sectional view of the facet portion in accordance with the sectional line B-B in FIG. 18.

FIGS. 18 to 21 show greatly simplified schematic views of a further embodiment of a facet portion 306. FIG. 18 shows a side view of the facet portion 306. FIG. 19 shows a plan view of the facet portion 306. FIG. 20 shows a sectional view of the facet portion 306 in accordance with the sectional line A-A in FIG. 18. FIG. 21 shows a sectional view of the facet portion 306 in accordance with the sectional line B-B in FIG. 18; For certain applications, it may be desirable to give the facet portion 306 a crescent-shaped or arcuate form in a plan view. In this case, the facet portion 306 corresponds to a curved bending beam. Here, too, the facet portion 306 has a homogeneous cross section.

If oppositely directed bending moments B1, B2 as described above are introduced into such a crescent-shaped facet portion 306, then this facet portion 306 will also deform primarily in a plane spanned by the y-direction y and the z-direction z. In addition, however, the facet portion 306 will also experience torsion about the y-direction y. This torsion is zero at both ends of the facet portion 306 and maximal in the middle of the facet portion 306.

As a result, the normal vector N of the optically effective surface 308 experiences a rotation both about the x-direction x and about the y-direction y. In the middle of the facet portion 306, the rotation about the y-direction y, as shown in FIG. 21, is maximal. The rotation about the x-direction x, by contrast, is zero in the middle of the facet portion 306 and maximal at both ends of the facet portion 306. Both rotations have a geometrically determined, fixed relationship to each other.

Figure 22:
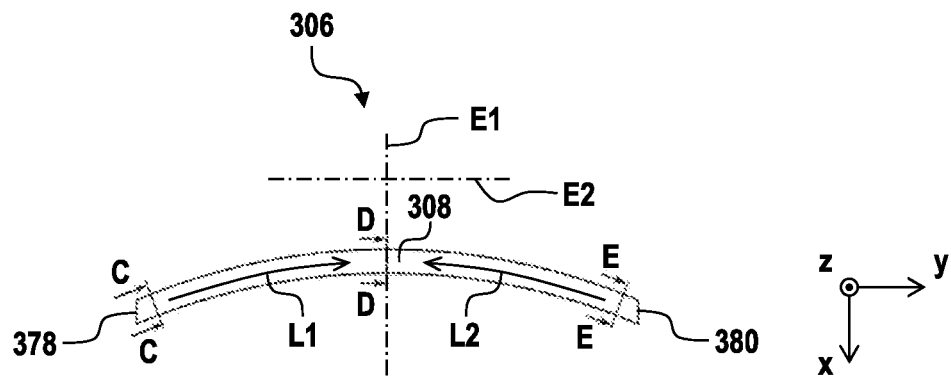
FIG. 22 shows a schematic plan view of a further embodiment of a facet portion for an optical system of the optical arrangement in accordance with FIG. 2.
Figure 23:
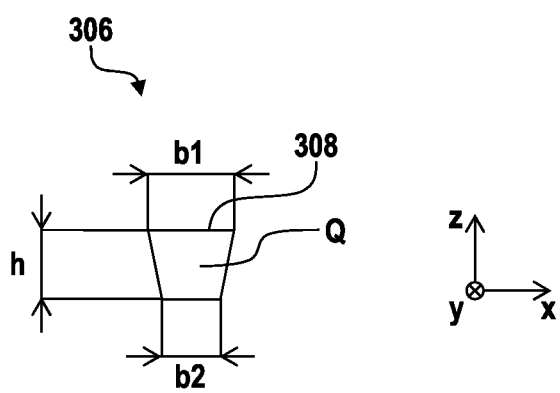
FIG. 23 shows a schematic sectional view of the facet portion in accordance with the sectional line C-C in FIG. 22.
Figure 24:
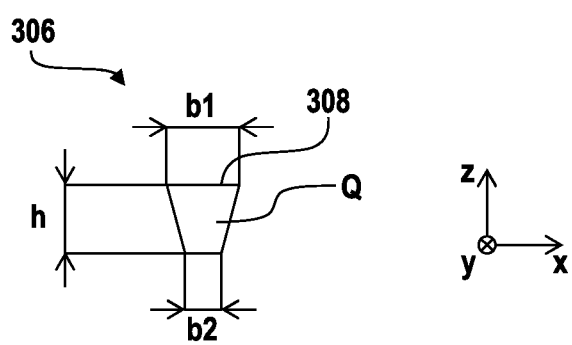
FIG. 24 shows a further schematic sectional view of the facet portion in accordance with the sectional line D-D in FIG. 22.
Figure 25:
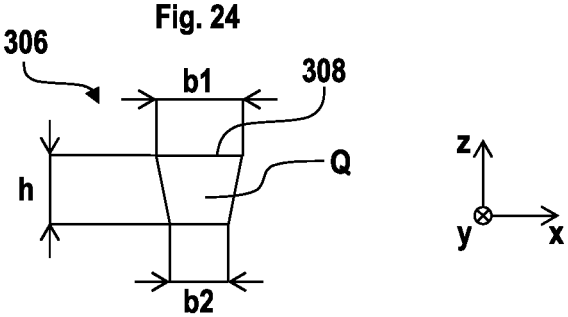
FIG. 25 shows a further schematic sectional view of the facet portion in accordance with the sectional line E-E in FIG. 22.

FIGS. 22 to 25 show greatly simplified schematic views of a further embodiment of a facet portion 306. In the plan view according to FIG. 22, the facet portion 306 or the optically effective surface 308 is curved in arcuate or crescent-shaped fashion. FIG. 23 shows a sectional view of the facet portion 306 in accordance with the sectional line C-C in FIG. 22. FIG. 24 shows a sectional view of the facet portion 306 in accordance with the sectional line D-D in FIG. 22. FIG. 25 shows a sectional view of the facet portion 306 in accordance with the sectional line E-E in FIG. 22. For specific applications, it can be desirable to minimize the rotation of the normal vector N about the y-direction y.

This can be achieved via a purposeful variation of the stiffness of the facet portion 306. The "stiffness" in the present case should be understood to mean the resistance of the facet portion 306 or generally a body to an elastic deformation owing to a force or a moment. For example, the "stiffness" should be understood to mean the torsional stiffness of the facet portion 306, that is to say the stiffness to withstand a torsional moment that twists the facet portion 306 or subjects it to torsion. The stiffness of a component is dependent firstly on the elastic properties of the material, such as the modulus of elasticity, for a, and secondly on the geometry of the deformed component.

The stiffness of the facet portion 306 can thus be varied by way of a variation of the modulus of elasticity of the material used for the facet portion 306. A variation of the modulus of elasticity as mentioned above can be attained by the use of a monolithically manufactured base body composed of two or more different materials. The base body forms the facet portion 306 or the facet portion 306 is manufactured from the base body. The base body can also comprise the main body 304. Such a base body can be produced from different metal powders by welding, plating or optionally by additive manufacturing, for example 3D printing. Using additive manufacturing methods, for example, hybrid components can be produced with a continuous transition between two different materials, for example copper and steel. The facet portion 306 can thus have a hybrid construction, for example composed of steel and copper.

Optionally, however, the geometry, for example a cross section Q of the facet portion 306, is varied. However, there is also the possibility of varying both the modulus of elasticity and the cross section Q. According to an embodiment, the facet portion 306 comprises a trapezoidal cross section Q with a constant or variable width b1 on its top side, that is to say the optically effective surface 308. A width b2 on its underside is likewise variable, but is narrower than the top side at every point of the facet portion 306. A height h of the cross section Q can likewise be variably chosen.

In the case of a constant cross section Q, the polar section modulus about the x-direction x and the y-direction y of the facet portion 306 is constant over the entire length of the facet portion 306. The "polar section modulus" is a measure of what resistance to the arising of internal stresses is offered by the facet portion 306 or, expressed more generally, a beam during loading. With a variable cross section Q, as explained above, the polar section modulus can be influenced in a targeted manner. This method is not limited just to trapezoidal cross sections Q, but rather is applicable to any cross sections with at least two variable cross-section parameters, such as width and height, for example. Cross sections Q in the shape of rectangles, triangles, semi-ellipses, rectangles with truncated corners or other more complex cross sections are conceivable, for example.

The facet portion 306 comprises a first end region 378 and a second end region 380. The bending moments B1, B2 are introduced into the end regions 378, 380. A plane of symmetry E1 with respect to which the facet portion 306 has a mirror-symmetrical structure is provided centrally between the end regions 378, 380. The section in accordance with FIG. 24 is arranged in the plane of symmetry E1. The plane of symmetry E1 is spanned by the x-direction x and the z-direction z, or is arranged parallel to a plane spanned by the x-direction x and the z-direction z.

The facet portion 306 has a longitudinal direction L1, L2. The longitudinal direction L1, L2 is oriented in each case from the corresponding end region 378, 380 in the direction of the plane of symmetry E1. Here the longitudinal direction L1, L2 in each case has an arcuately curved profile. By way of example, the stiffness of the facet portion 306, as viewed along the longitudinal direction L1, L2, decreases in the direction of the plane of symmetry E1 starting from the end regions 378, 380.

By way of example, this can be achieved by virtue of the cross section Q or a cross-sectional area of the cross section Q being smallest in the plane of symmetry E1 and increasing toward the end regions 378, 380. However, a profile or a gradient of the stiffness, which is to say the profile of the stiffness along the respective longitudinal direction L1, L2, is symmetrical with respect to the plane of symmetry E1. That is to say the cross section Q in accordance with the sectional line D-D as per FIG. 22 is smaller than the cross section Q in accordance with the sectional lines C-C and E-E. The same applies to the polar section modulus.

Figure 26:
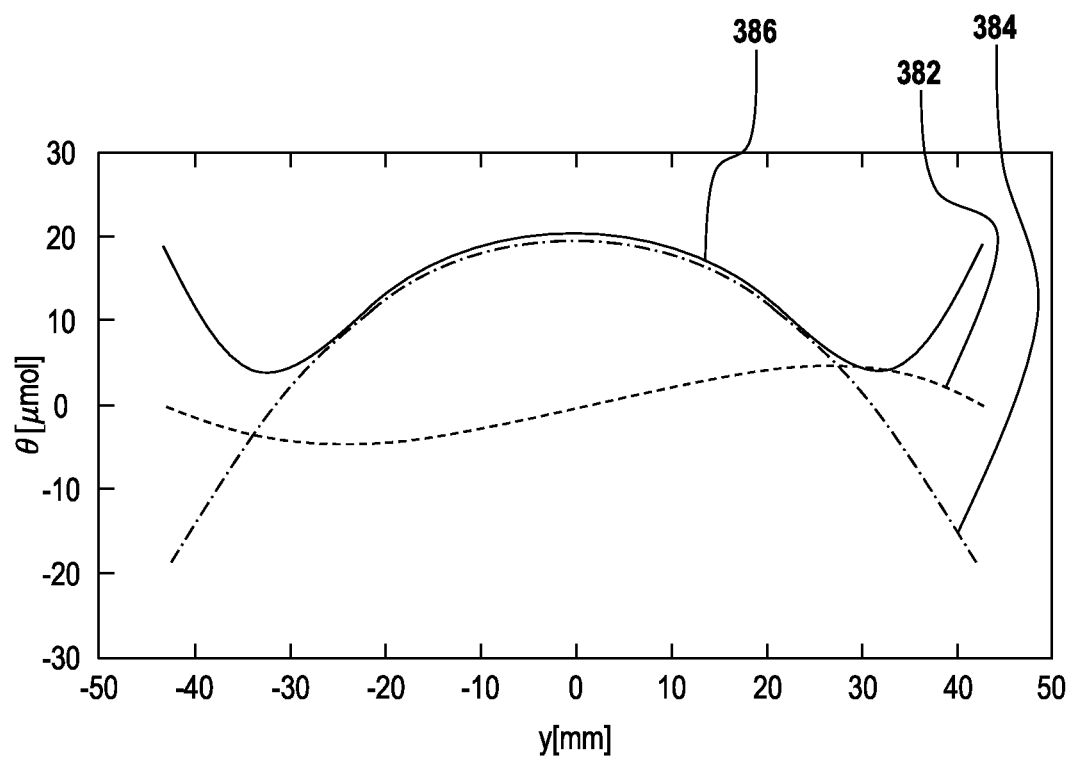
FIG. 26 shows a schematic diagram showing an error profile of a normal vector over the length of the facet portion in accordance with FIG. 18.

FIG. 26 shows the error profile of the normal vector N over the length of the facet portion 306 for a specific change in the cross section Q. The y-direction y in mm is plotted on the abscissa axis in this case. An error angle $\theta$ in μrad is plotted on the ordinate axis. A 90 mm long facet portion 306 with a rectangular cross section Q with a width b and height h of 4 mm throughout is considered (FIG. 24) by way of example.

A curve 382 represents the tilt of the normal vector N in the plane E2 spanned by the y-direction y and the z-direction z. A curve 384 represents the tilt of the normal vector N in a plane spanned by the x-direction x and the z-direction z. A curve 386 shows the tilt of the normal vector N resulting from the curves 382, 384. As is evident from the curve 386, the error angle $\theta$ of the resultant normal vector N varies between 5 and 19 μrad.

Figure 27:
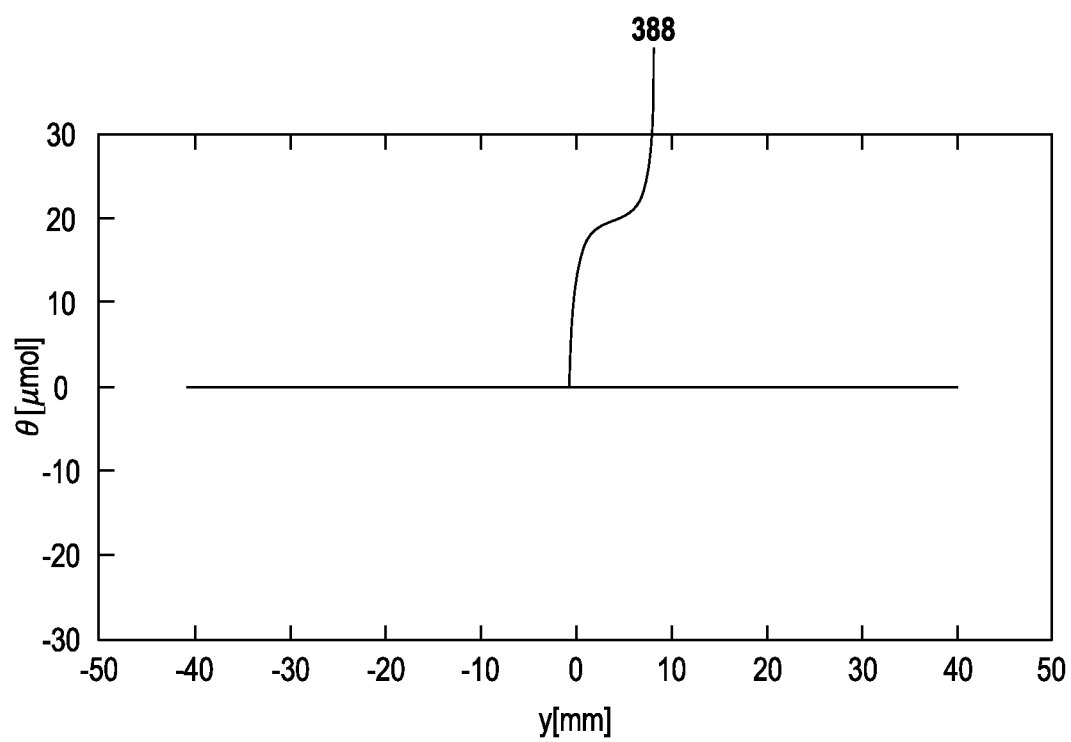
FIG. 27 shows a schematic diagram showing an error profile of a normal vector over the length of the facet portion in accordance with FIG. 22.

In contrast to FIG. 26, FIG. 27 shows the error profile of the normal vector M for an 80 mm long facet portion 306 with a variable height h (FIG. 23) and constant width b1 (FIG. 23) of the cross section Q on the top side and variable width b2 (FIG. 23) on the underside. For a particular variable cross section Q, chosen according to the above-described method, the resultant error in the resultant normal vector N can be completely eliminated, as shown on the basis of curve 388. That is to say a deformation of the facet portion 306 only occurs in a plane E2 spanned by the y-direction y and the z-direction z. The plane E2 is oriented perpendicularly to the plane of symmetry E1.

Returning now to FIG. 4, the optical arrangement 200 further comprises a measuring unit 244, which is shown in FIG. 4 in a side view (left) and in a plan view (right). The function of the measuring unit 244 is explained hereinafter. Piezoactuators can exhibit various long-lasting creep effects and drift effects that cannot be recorded by the aforementioned measuring systems on account of their own creep behavior.

Such effects can be, for example, creep owing to stress relaxation in an adhesive connection between the respective actuating element 324, 326, 350, 352 and the main body 304, a drift of the respective actuating element 324, 326, 350, 352 on account of charge loss, drift of the charge amplifier and/or material creep in the facet portion 306 or the main body 304. These creep effects can lead to a deviation of the actual curvature from the target curvature specified by the control and may occur over a period of hours, days or weeks depending on the creep effect and creep rate.

The measuring unit 244 can measure these effects and deriving a correction signal. The EUV radiation 108A of the beam path 216 is incident on the pivotable field facets 222A, 222B, 222C, 222D, 222E with changeable curvatures. Depending on the switching position, these reflect the EUV radiation onto different pupil facets 230A, 230B, 230C, 230D, 230E, 230F. The arrangement according to FIG. 4 includes the measuring unit 244 which is independent of the pupil facet mirror 204.

To measure the curvature of a field facet 222A, 222B, 222C, 222D, 222E, 222F, one of the field facets 222A, 222B, 222C, 222D, 222E, 222F, for example the field facet 222C, is tilted in such a way that the EUV radiation 108A reflected thereby is incident on measuring unit 244. The measuring unit 244 then detects the size of the light spot, optionally in a plurality of spatial directions, for example in length and width. A correction signal for the actuating elements 324, 326, 350, 352 for the facet curvature is calculated via a control unit (not shown) from the size of the light spot. Using a closed control loop, it is now possible to adjust the light spot to a minimum size and thus set the best possible focusing by way of iterative optimization. This calibration is implemented sequentially for all field facets 222A, 222B, 222C, 222D, 222E, 222F and can be performed for each field facet 222A, 222B, 222C, 222D, 222E, 222F over a period of hours, days or weeks, depending on the creep effect and creep rate.

The measuring unit 244 can be embodied as a CCD-Sensor (Charge-Coupled Device, CCD), for example. In an embodiment, the pupil facets 230A, 230B, 230C, 230D, 230E, 230F of the pupil facet mirror 204 are arranged in a circular area. In this case, it can be desirable to arrange the measuring unit 244 in the center of the area, since this reduces, to the greatest possible extent, the variation in the switching angles of the field facets 222A, 222B, 222C, 222D, 222E, 222F for illuminating the measuring unit 244, and realizes the steepest possible angle of incidence of the light from all field facets on the measuring unit. Alternatively, the measuring unit 244 can be arranged independently and next to the pupil facet mirror 204, as shown in FIG. 4, or (not shown) it can be arranged at the edge of the pupil facet mirror 204.

Although the present disclosure has been described on the basis of exemplary embodiments, it is modifiable in diverse ways.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110 Mirror
112 Mirror
114 Mirror
116 Mirror
118 Mirror
120 Photomask
122 Mirror
124 Wafer
126 Optical axis
128 Lens element
130 Mirror
132 Medium
200 Optical arrangement
202 Mirror/field facet mirror
204 Mirror/pupil facet mirror
206 Mirror
208 Mirror
210 Deflection mirror
212 Housing
214 Intermediate focus
216 Beam path
218 Object plane
220 Object field
222 Facet/field facet
222A Field facet
222B Field facet
222C Field facet
222D Field facet
222E Field facet
222F Field facet
224 Main body
226 Optically effective surface
228 Main body
230A Pupil facet
230B Pupil facet
230C Pupil facet
230D Pupil facet
230E Pupil facet
230F Pupil facet
232 Optically effective surface
234A Imaging light beam
234B Imaging light beam
234C Imaging light beam
236 Plasma source
238 Collector
240 Imaging surface
242 Area
244 Measuring unit
300A Optical system/field facet system
300B Optical system/field facet system
300C Optical system/field facet system
300D Optical system/field facet system
300E Optical system/field facet system
302 Optical element
304 Main body
306 Facet portion
306' Facet portion
308 Optically effective surface
310 Gap
312 Lever arm
314 Lever arm
316 Connecting region
318 Connecting region
320 Joint portion
322 Joint portion
324 Actuating element
326 Actuating element
328 Temperature sensor
330 Temperature sensor
332 Recess
334 Recess
336 Temperature sensor
338 Temperature sensor
340 Temperature sensor
342 Temperature sensor
344 Displacement measuring sensor
346 Displacement measuring sensor
348 Control unit
350 Actuating element
352 Actuating element
354 Lever arm
356 Lever arm
358 Lever arm
360 Lever arm
362 Joint portion
364 Joint portion
366 Decoupling joint 368 Decoupling joint
370 Decoupling joint
372 Decoupling joint
374 Temperature sensor
376 Temperature sensor
378 End region
380 End region
382 Curve
384 Curve
386 Curve
388 Curve
b Width
b1 Width
b2 Width
B1 Bending moment
B2 Bending moment
E1 Plane of symmetry
E2 Plane
h Height
K1 Radius of curvature
K2 Radius of curvature
L1 Longitudinal direction
L2 Longitudinal direction
M1 Mirror
M2 Mirror
M3 Mirror
M4 Mirror
M5 Mirror
M6 Mirror
N Normal vector
P1 Tilt position
P2 Tilt position
P3 Tilt position
Q Cross section
x x-direction
y y-direction
z z-direction
θ Error angle

What is claimed is:

1. A field facet system, comprising:
an optical element comprising an elastically deformable facet portion, the elastically deformable facet portion comprising a light-reflecting optically effective surface; and
an actuating element configured to introduce a bending moment into the facet portion to deform the facet portion to change a radius of curvature of the optically effective surface,
wherein:
the facet portion is arcuately curved in a plan view of the optically effective surface; and
the facet portion has a variable stiffness along a longitudinal direction of the facet portion so that a normal vector perpendicular to the optically effective surface tilts exclusively about a spatial direction when the bending moment is introduced into the facet portion.

2. The field facet system of claim 1, wherein the facet portion has a variable modulus of elasticity along the longitudinal direction.

3. The field facet system of claim 1, wherein a cross section of the facet portion has a variable polar section modulus along the longitudinal direction.

4. The field facet system of claim 3, wherein the cross section is trapezoidal.

5. The field facet system of claim 4, wherein:
the cross section comprises a first width facing the optically effective surface;
the cross section comprises a second width facing away from the optically effective surface; and
the first width is greater than the second width.

6. The field facet system of claim 5, wherein the first width is constant along the longitudinal direction, and the second width is variable along the longitudinal direction.

7. The field facet system of claim 6, wherein the cross section comprises a variable height along the longitudinal direction.

8. The field facet system of claim 5, wherein the cross section comprises a variable height along the longitudinal direction.

9. The field facet system of claim 3, wherein the facet portion comprises first and second ends, and the facet portion is mirror-symmetric with respect to a plane of symmetry arranged centrally between the first and second end regions.

10. The field facet system of claim 9, wherein the cross section is smallest in the plane of symmetry.

11. The field facet system of claim 10, wherein the cross section increases in size proceeding from the plane of symmetry in a direction of the first end region and in a direction of the second and region.

12. The field facet system of claim 11, further comprising first and second actuating elements, wherein the first actuating element is configured to introduce a first bending moment in the first end, the second actuating element is configured to introduce a second bending moment in the second end, and the first bending moment is opposite the second bending moment.

13. The field facet system of claim 10, further comprising first and second actuating elements, wherein the first actuating element is configured to introduce a first bending moment in the first end, the second actuating element is configured to introduce a second bending moment in the second end, and the first bending moment is opposite the second bending moment.

14. The field facet system of claim 9, further comprising first and second actuating elements, wherein the first actuating element is configured to introduce a first bending moment in the first end, the second actuating element is configured to introduce a second bending moment in the second end, and the first bending moment is opposite the second bending moment.

15. The field facet system of claim 3, wherein the facet portion has a variable modulus of elasticity along the longitudinal direction.

16. The field facet system of claim 1, wherein the normal vector tilts exclusively about a first spatial direction when the bending moment is introduced into the facet portion.

17. The field facet system of claim 16, wherein the bending moment acts about the first spatial direction.

18. The field facet system of claim 17, wherein:
a second spatial direction is perpendicular to the first spatial direction;
a third spatial direction perpendicular to both the first and second spatial directions; and
the facet portion deforms exclusively in a plane spanned by the second and third spatial directions when the bending moment is introduced.

19. The field facet system of claim 16, wherein:
in a second spatial direction is perpendicular to the first spatial direction;
a third spatial direction perpendicular to both the first and
second spatial directions; and the facet portion deforms exclusively in a plane spanned by the second and third spatial directions when the bending moment is introduced.

20. An apparatus, comprising:
a field facet system according to claim 1, wherein the apparatus is a lithography apparatus.

* * * * *

UNITED STATES PATENT AND TRADEMARK OFFICE
CERTIFICATE OF CORRECTION

PATENT NO. : 12,353,137 B2
APPLICATION NO. : 18/318342
DATED : July 8, 2025
INVENTOR(S) : Arno Schmittner et al.

Page 1 of 1

It is certified that error appears in the above-identified patent and that said Letters Patent is hereby corrected as shown below:

In the Specification

Column 7, Line 26, delete ""A (n);" and insert -- "A(n); --.

Column 11, Line 47, after "200" delete "in".

Column 13, Line 37, after "230F" delete "des".

Column 13, Line 37, after "230F" delete "des".

Column 13, Line 39, after "100A" insert -- ) --.

Column 15, Line 39, after "z-direction z" insert -- . --.

Column 16, Line 47, delete "themopiles." and insert -- thermopiles. --.

In the Claims

Column 26, Line 25, in Claim 11, delete "and" and insert -- end --.

Column 26, Line 64, in Claim 19, before "a" delete "in".

Signed and Sealed this
Nineteenth Day of August, 2025

Coke Morgan Stewart
*Acting Director of the United States Patent and Trademark Office*